United States Patent
Sagi et al.

(10) Patent No.: US 10,707,907 B2
(45) Date of Patent: Jul. 7, 2020

(54) SYSTEM AND METHOD FOR NONLINEARITY ESTIMATION WITH REFERENCE SIGNALS

(71) Applicant: QUALCOMM Incorporated, San Diego, CA (US)

(72) Inventors: Ariel Yaakov Sagi, Haifa (IL); Igor Gutman, Ramat Gan (IL)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 16/222,884

(22) Filed: Dec. 17, 2018

(65) Prior Publication Data

US 2019/0190552 A1    Jun. 20, 2019

Related U.S. Application Data

(60) Provisional application No. 62/607,161, filed on Dec. 18, 2017.

(51) Int. Cl.
*H04B 1/04* (2006.01)
*H04B 1/10* (2006.01)
(Continued)

(52) U.S. Cl.
CPC ........ *H04B 1/0475* (2013.01); *H03F 1/3241* (2013.01); *H03F 3/24* (2013.01); *H04B 1/109* (2013.01); *H04L 7/0091* (2013.01); *H04L 25/0226* (2013.01); *H04L 25/03019* (2013.01); *H04L 25/03343* (2013.01); *H03F 2200/451* (2013.01)

(58) Field of Classification Search
CPC ........ H04L 27/2613; H04L 2025/0342; H04B 1/0475; H03F 1/3247
See application file for complete search history.

(56) References Cited

U.S. PATENT DOCUMENTS

2005/0032472 A1*  2/2005  Jiang .................... H04B 1/0475
                                                                       455/13.4
2011/0069749 A1*  3/2011  Forrester ........... H04L 25/03038
                                                                         375/232
(Continued)

FOREIGN PATENT DOCUMENTS

EP         1276234 A1      1/2003
WO       2011053855 A1     5/2011

OTHER PUBLICATIONS

International Search Report and Written Opinion—PCT/US2018/066264—ISA/EPO—dated Mar. 29, 2019.

*Primary Examiner* — David S Huang
(74) *Attorney, Agent, or Firm* — Qualcomm IP Dept.; James Hunt Yancey, Jr.

(57) ABSTRACT

A transmitter may be configured to generate a reference signal having a non-constant envelope for nonlinearity estimation by a receiver. The transmitter may transmit the reference signal. A receiver may be configured to receive, from the transmitter, the reference signal having the non-constant envelope. The receiver may estimate at least one nonlinearity characteristic based on the reference signal having the non-constant envelope. The receiver may transmit feedback based on the at least one nonlinearity characteristic and/or perform at least one digital post distortion (DPoD) operation based on the at least one nonlinearity characteristic.

44 Claims, 11 Drawing Sheets

(51) Int. Cl.
*H04L 7/00* (2006.01)
*H03F 3/24* (2006.01)
*H04L 25/03* (2006.01)
*H03F 1/32* (2006.01)
*H04L 25/02* (2006.01)

(56) References Cited

U.S. PATENT DOCUMENTS

2012/0243596 A1* 9/2012 Lovell ................. H04L 25/0232
   375/229
2012/0281629 A1* 11/2012 Zhou .................... H04J 11/0073
   370/328
2016/0204822 A1   7/2016 Yu et al.

* cited by examiner

SYSTEM AND METHOD FOR NONLINEARITY ESTIMATION WITH REFERENCE SIGNALS

CROSS-REFERENCE TO RELATED APPLICATION(S)

This application claims the benefit of U.S. Provisional Application Ser. No. 62/607,161, entitled "NONLINEARITY ESTIMATION USING NON-CONSTANT ENVELOPE REFERENCE SIGNALS" and filed on Dec. 18, 2017, which is expressly incorporated by reference herein in its entirety.

BACKGROUND

Technical Field

The present disclosure relates generally to communication systems, and more particularly, to a transmitter configured to generate a reference signal having a non-constant envelope that may be used for nonlinearity estimation.

INTRODUCTION

Wireless communication systems are widely deployed to provide various telecommunication services such as telephony, video, data, messaging, and broadcasts. Typical wireless communication systems may employ multiple-access technologies capable of supporting communication with multiple users by sharing available system resources. Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

These multiple access technologies have been adopted in various telecommunication standards to provide a common protocol that enables different wireless devices to communicate on a municipal, national, regional, and even global level. An example telecommunication standard is 5G New Radio (NR). 5G NR is part of a continuous mobile broadband evolution promulgated by Third Generation Partnership Project (3GPP) to meet new requirements associated with latency, reliability, security, scalability (e.g., with Internet of Things (IoT)), and other requirements. 5G NR includes services associated with enhanced mobile broadband (eMBB), massive machine type communications (mMTC), and ultra reliable low latency communications (URLLC). Some aspects of 5G NR may be based on the 4G Long Term Evolution (LTE) standard. There exists a need for further improvements in 5G NR technology. These improvements may also be applicable to other multi-access technologies and the telecommunication standards that employ these technologies.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In various wireless communications system, a transmitter may include various nonlinear components, such as high power amplifiers with limit linear dynamic range. Some nonlinear components may distort a transmitted signal due to high peak to average power ratio (PAPR). In order to reduce this distortion, a back off may be applied (e.g., to the transmission power). However, the back off may reduce power efficiency.

The efficiency of radiated power may be influential in the design of a radio frequency (RF) transmitter. In order to improve efficiency, at least one digital pre-distortion (DPD) operation and/or digital post-distortion (DPoD) operations may be performed based on non-linearity estimations from the transmission of the signal. For example, a transmitter may apply DPD operations and/or a receiver may apply DPoD operations. In order perform DPD and/or DPoD operations, the non-linearity characteristics of various components in the transmitter and/or the receiver (e.g., amplifiers, signal converters, etc.) may be estimated.

The present disclosure may provide approaches to estimation of nonlinearity characteristics of various components of the transmitter and/or receiver. Various approaches described herein may avoid data-driven nonlinearity estimation, which may use iterative decoding for signals having a relatively high signal-to-noise ratio (SNR) and with a modulation scheme of 16 quadrature amplitude modulation (QAM) or a higher modulation scheme. In various approaches, various portions of a transmitted signal may be used for nonlinearity estimation, such as a preamble. The dynamic range of a transmitted reference signal may be modified using non-constant envelope constellations in order to cover many (potentially all) dynamic ranges of nonlinear components. Some approaches described in the present disclosure may differ from some protocols, which may use signal preambles with a constant (or approximately constant, due to some shaping pulse) envelope in order to avoid nonlinearity effects (e.g., for a high-power amplifier). Signal preambles with a constant (or nearly constant) envelope may prevent nonlinearity estimation by a receiver.

In an aspect of the disclosure, a method, a computer-readable medium, and an apparatus are provided. The apparatus may be a transmitter. The apparatus may generate a reference signal having a non-constant envelope for nonlinearity estimation by a receiver. The apparatus may transmit the reference signal, e.g., to a receiver. In an aspect, the reference signal includes a primary synchronization signal. In an aspect, the primary synchronization signal is based on a Zadoff-Chu sequence. In an aspect, the reference signal includes one of a short training sequence (STS) or a guard interval (GI). In an aspect, the reference signal includes a preamble having the non-constant envelope. In an aspect, the generation of the reference signal having the non-constant envelope includes modulation of the reference signal to have a first dynamic range, the first dynamic range being higher than a second dynamic range of another signal having a constant envelope. The apparatus may further receive, from the receiver, feedback associated with the nonlinearity estimation, and perform at least one DPD operation based on the feedback. In an aspect, the performance of the at least one DPD operation based on the feedback comprises adjusting one or more coefficients associated with at least one of a high-power amplifier (HPA) or a digital to analog converter (DAC).

In an aspect of the disclosure, a method, a computer-readable medium, and an apparatus are provided. The apparatus may be a receiver. The apparatus may receive a reference signal having a non-constant envelope. The apparatus may estimate at least one nonlinearity characteristic based on the reference signal having the non-constant envelope. The apparatus may at least one of: transmit feedback based on the at least one nonlinearity characteristic, or perform at least one DPoD operation based on the at least one nonlinearity characteristic. In an aspect, the reference signal includes a primary synchronization signal. In an aspect, the primary synchronization signal is based on a Zadoff-Chu sequence. In an aspect, the reference signal includes one of a STS or a GI. In an aspect, the reference signal includes a preamble having the non-constant envelope. In an aspect, the estimation of the at least one nonlinearity characteristic based on the reference signal having the non-constant envelope is based on a least-squares algorithm. In an aspect, the performance of the at least one DPoD operation based on the at least one nonlinearity characteristic comprises adjusting one or more coefficients associated with at least one of a low-noise amplifier (LNA) or an analog to digital converter (ADC).

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

DETAILED DESCRIPTION

Figure 1:
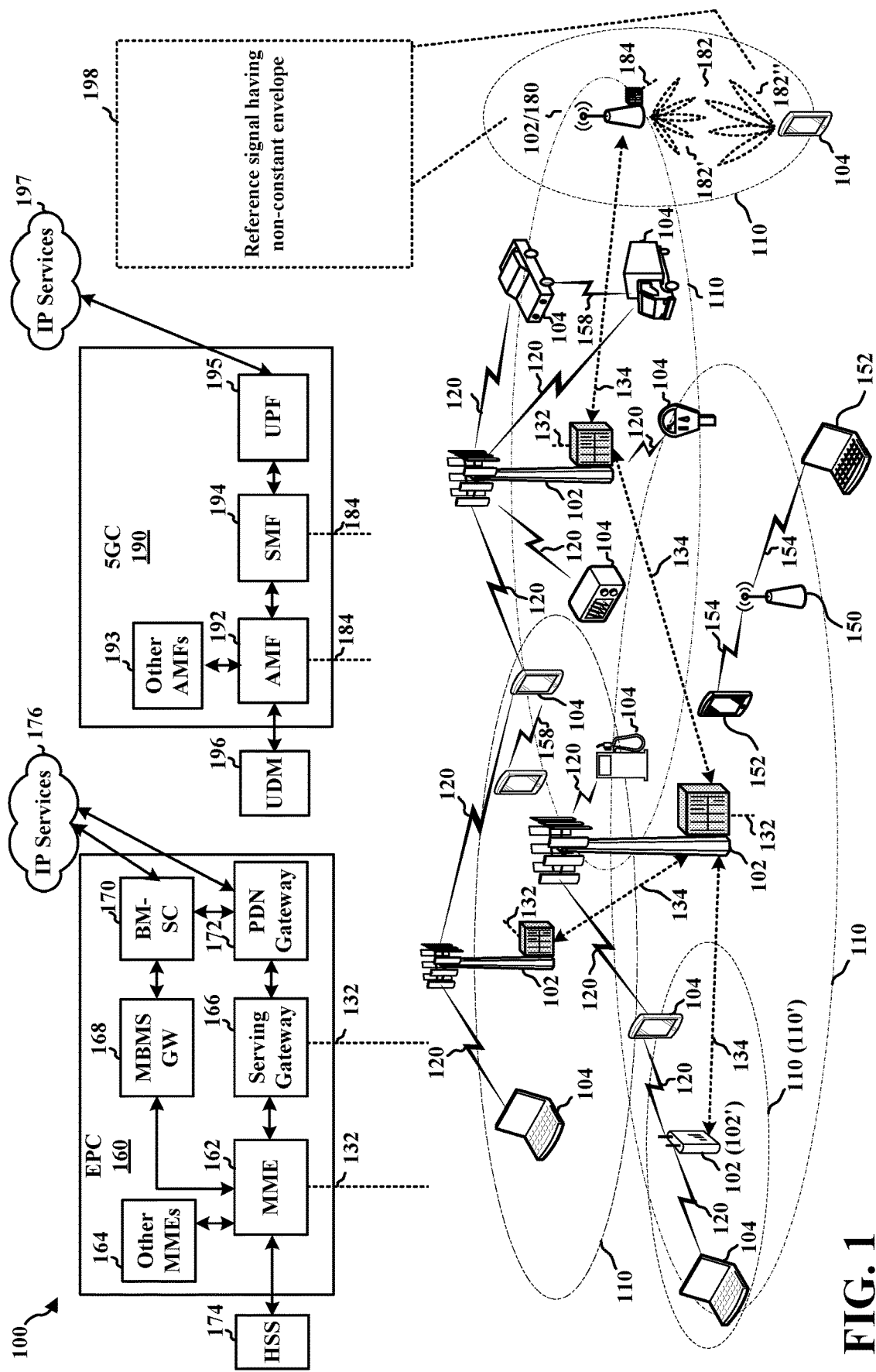
FIG. 1 is a diagram illustrating an example of a wireless communications system and an access network.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of telecommunication systems will now be presented with reference to various apparatus and methods. These apparatus and methods will be described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example embodiments, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that can be used to store computer executable code in the form of instructions or data structures that can be accessed by a computer.

FIG. 1 is a diagram illustrating an example of a wireless communications system and an access network 100. The wireless communications system (also referred to as a wireless wide area network (WWAN)) includes base stations 102, UEs 104, an Evolved Packet Core (EPC) 160, and a 5G Core (5GC) 190. The base stations 102 may include macro cells (high power cellular base station) and/or small cells (low power cellular base station). The macro cells include base stations. The small cells include femtocells, picocells, and microcells.

The base stations 102 configured for 4G LTE (collectively referred to as Evolved Universal Mobile Telecommunications System (UMTS) Terrestrial Radio Access Network (E-UTRAN)) may interface with the EPC 160 through backhaul links 132 (e.g., S1 interface). The base stations 102 configured for 5G NR (collectively referred to as Next Generation RAN (NG-RAN)) may interface with 5GC 190 through backhaul links 184. In addition to other functions, the base stations 102 may perform one or more of the following functions: transfer of user data, radio channel ciphering and deciphering, integrity protection, header compression, mobility control functions (e.g., handover, dual connectivity), inter-cell interference coordination, connection setup and release, load balancing, distribution for non-access stratum (NAS) messages, NAS node selection, synchronization, radio access network (RAN) sharing, multimedia broadcast multicast service (MBMS), subscriber and equipment trace, RAN information management (RIM), paging, positioning, and delivery of warning messages. The base stations 102 may communicate directly or indirectly (e.g., through the EPC 160 or 5GC 190) with each other over backhaul links 134 (e.g., X2 interface). The backhaul links 134 may be wired or wireless.

The base stations 102 may wirelessly communicate with the UEs 104. Each of the base stations 102 may provide communication coverage for a respective geographic coverage area 110. There may be overlapping geographic coverage areas 110. For example, the small cell 102' may have a coverage area 110' that overlaps the coverage area 110 of one or more macro base stations 102. A network that includes both small cell and macro cells may be known as a heterogeneous network. A heterogeneous network may also include Home Evolved Node Bs (eNBs) (HeNBs), which may provide service to a restricted group known as a closed subscriber group (CSG). The communication links 120 between the base stations 102 and the UEs 104 may include uplink (UL) (also referred to as reverse link) transmissions from a UE 104 to a base station 102 and/or downlink (DL) (also referred to as forward link) transmissions from a base station 102 to a UE 104. The communication links 120 may use multiple-input and multiple-output (MIMO) antenna technology, including spatial multiplexing, beamforming, and/or transmit diversity. The communication links may be through one or more carriers. The base stations 102/UEs 104 may use spectrum up to Y MHz (e.g., 5, 10, 15, 20, 100, 400, etc. MHz) bandwidth per carrier allocated in a carrier aggregation of up to a total of Yx MHz (x component carriers) used for transmission in each direction. The carriers may or may not be adjacent to each other. Allocation of carriers may be asymmetric with respect to DL and UL (e.g., more or less carriers may be allocated for DL than for UL). The component carriers may include a primary component carrier and one or more secondary component carriers. A primary component carrier may be referred to as a primary cell (PCell) and a secondary component carrier may be referred to as a secondary cell (SCell).

Certain UEs 104 may communicate with each other using device-to-device (D2D) communication link 158. The D2D communication link 158 may use the DL/UL WWAN spectrum. The D2D communication link 158 may use one or more sidelink channels, such as a physical sidelink broadcast channel (PSBCH), a physical sidelink discovery channel (PSDCH), a physical sidelink shared channel (PSSCH), and a physical sidelink control channel (PSCCH). D2D communication may be through a variety of wireless D2D communications systems, such as for example, FlashLinQ, WiMedia, Bluetooth, ZigBee, Wi-Fi based on the IEEE 802.11 standard, LTE, or NR.

The wireless communications system may further include a Wi-Fi access point (AP) 150 in communication with Wi-Fi stations (STAs) 152 via communication links 154 in a 5 GHz unlicensed frequency spectrum. When communicating in an unlicensed frequency spectrum, the STAs 152/AP 150 may perform a clear channel assessment (CCA) prior to communicating in order to determine whether the channel is available.

The small cell 102' may operate in a licensed and/or an unlicensed frequency spectrum. When operating in an unlicensed frequency spectrum, the small cell 102' may employ NR and use the same 5 GHz unlicensed frequency spectrum as used by the Wi-Fi AP 150. The small cell 102', employing NR in an unlicensed frequency spectrum, may boost coverage to and/or increase capacity of the access network. A base station 102, whether a small cell 102' or a large cell (e.g., macro base station), may include an eNB, gNodeB (gNB), or other type of base station. Some base stations, such as gNB 180 may operate in a traditional sub 6 GHz spectrum, in millimeter wave (mmW) frequencies, and/or near mmW frequencies in communication with the UE 104. When the gNB 180 operates in mmW or near mmW frequencies, the gNB 180 may be referred to as an mmW base station. Extremely high frequency (EHF) is part of the RF in the electromagnetic spectrum. EHF has a range of 30 GHz to 300 GHz and a wavelength between 1 millimeter and 10 millimeters. Radio waves in the band may be referred to as a millimeter wave. Near mmW may extend down to a frequency of 3 GHz with a wavelength of 100 millimeters. The super high frequency (SHF) band extends between 3 GHz and 30 GHz, also referred to as centimeter wave. Communications using the mmW/near mmW radio frequency band (e.g., 3 GHz-300 GHz) has extremely high path loss and a short range. The mmW base station 180 may utilize beamforming 182 with the UE 104 to compensate for the extremely high path loss and short range.

The base station 180 may transmit a beamformed signal to the UE 104 in one or more transmit directions 182'. The UE 104 may receive the beamformed signal from the base station 180 in one or more receive directions 182". The UE 104 may also transmit a beamformed signal to the base station 180 in one or more transmit directions. The base station 180 may receive the beamformed signal from the UE 104 in one or more receive directions. The base station 180/UE 104 may perform beam training to determine the best receive and transmit directions for each of the base station 180/UE 104. The transmit and receive directions for the base station 180 may or may not be the same. The transmit and receive directions for the UE 104 may or may not be the same.

The EPC 160 may include a Mobility Management Entity (MME) 162, other MMES 164, a Serving Gateway 166, a Multimedia Broadcast Multicast Service (MBMS) Gateway 168, a Broadcast Multicast Service Center (BM-SC) 170, and a Packet Data Network (PDN) Gateway 172. The MME 162 may be in communication with a Home Subscriber Server (HSS) 174. The MME 162 is the control node that processes the signaling between the UEs 104 and the EPC 160. Generally, the MME 162 provides bearer and connection management. All user Internet protocol (IP) packets are transferred through the Serving Gateway 166, which itself is connected to the PDN Gateway 172. The PDN Gateway 172 provides UE IP address allocation as well as other functions.

The PDN Gateway 172 and the BM-SC 170 are connected to the IP Services 176. The IP Services 176 may include the Internet, an intranet, an IP Multimedia Subsystem (IMS), a PS Streaming Service, and/or other IP services. The BM-SC 170 may provide functions for MBMS user service provisioning and delivery. The BM-SC 170 may serve as an entry point for content provider MBMS transmission, may be used to authorize and initiate MBMS Bearer Services within a public land mobile network (PLMN), and may be used to schedule MBMS transmissions. The MBMS Gateway 168 may be used to distribute MBMS traffic to the base stations 102 belonging to a Multicast Broadcast Single Frequency Network (MBSFN) area broadcasting a particular service, and may be responsible for session management (start/stop) and for collecting eMBMS related charging information.

The 5GC 190 may include a Access and Mobility Management Function (AMF) 192, other AMFs 193, a Session Management Function (SMF) 194, and a User Plane Function (UPF) 195. The AMF 192 may be in communication with a Unified Data Management (UDM) 196. The AMF 192 is the control node that processes the signaling between the UEs 104 and the 5GC 190. Generally, the AMF 192 provides QoS flow and session management. All user Internet protocol (IP) packets are transferred through the UPF 195. The UPF 195 provides UE IP address allocation as well as other functions. The UPF 195 is connected to the IP Services 197. The IP Services 197 may include the Internet, an intranet, an IP Multimedia Subsystem (IMS), a PS Streaming Service, and/or other IP services.

The base station may also be referred to as a gNB, Node B, evolved Node B (eNB), an access point, a base transceiver station, a radio base station, a radio transceiver, a transceiver function, a basic service set (BSS), an extended service set (ESS), a transmit reception point (TRP), or some other suitable terminology. The base station 102 provides an access point to the EPC 160 or 5GC 190 for a UE 104. Examples of UEs 104 include a cellular phone, a smart phone, a session initiation protocol (SIP) phone, a laptop, a personal digital assistant (PDA), a satellite radio, a global positioning system, a multimedia device, a video device, a digital audio player (e.g., MP3 player), a camera, a game console, a tablet, a smart device, a wearable device, a vehicle, an electric meter, a gas pump, a large or small kitchen appliance, a healthcare device, an implant, a sensor/actuator, a display, or any other similar functioning device. Some of the UEs 104 may be referred to as IoT devices (e.g., parking meter, gas pump, toaster, vehicles, heart monitor, etc.). The UE 104 may also be referred to as a station, a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology.

Referring again to FIG. 1, in certain aspects, the base station 180 may be configured to generate a reference signal 198 having a non-constant envelope. The base station 180 may transmit the reference signal 198 having the non-constant envelope to the UE 104. The UE 104 may be configured to receive the reference signal 198 having the non-constant envelope from the base station 180. The UE 104 may estimate one or more nonlinearity characteristics based on the reference signal 198. Thereafter, the UE 104 may (1) transmit, to the base station 180, feedback based on the one or more nonlinearity characteristics, (2) perform at least one digital post distortion (DPoD) operation based on the one or more nonlinearity characteristics, or (3) both transmit feedback based on the one or more nonlinearity characteristics and perform the at least one DPoD operation based on the one or more nonlinearity characteristics. When the UE 104 transmits feedback based on the one or more nonlinearity characteristics to the base station 180, the base station 180 may perform at least one digital pre-distortion (DPD) operation based on the feedback. In this way, the UE 104 and/or the base station 180 may improve the response, throughput, and/or capacity of one or more channels on which the UE 104 and the base station 180 communicate.

Figure 2:
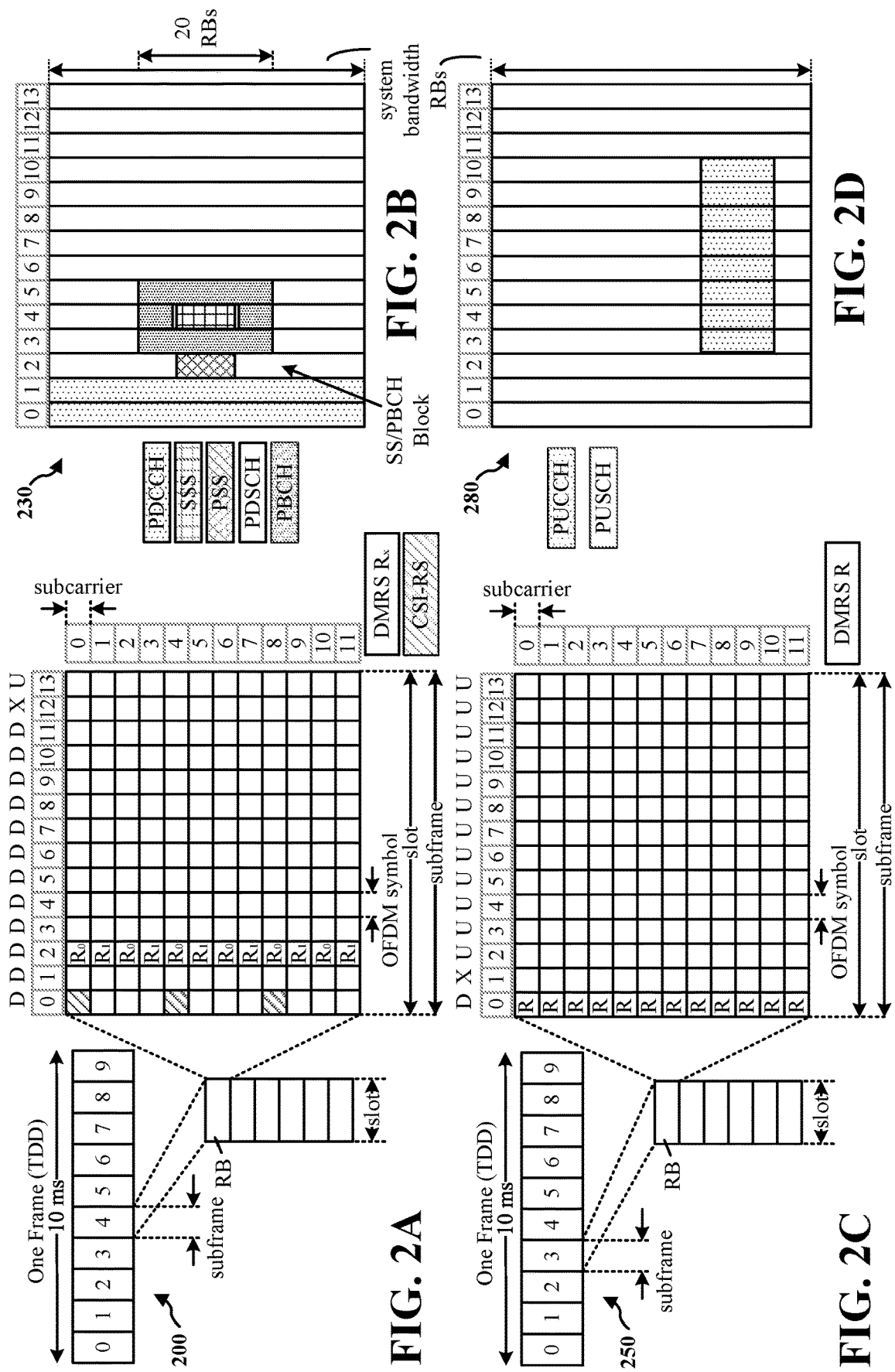
FIGS. 2A, 2B, 2C, and 2D are diagrams illustrating examples of a first 5G/NR frame, DL channels within a 5G/NR subframe, a second 5G/NR frame, and UL channels within a 5G/NR subframe, respectively.

FIG. 2A is a diagram 200 illustrating an example of a first subframe within a 5G/NR frame structure. FIG. 2B is a diagram 230 illustrating an example of DL channels within a 5G/NR subframe. FIG. 2C is a diagram 250 illustrating an example of a second subframe within a 5G/NR frame structure. FIG. 2D is a diagram 280 illustrating an example of UL channels within a 5G/NR subframe. The 5G/NR frame structure may be FDD in which for a particular set of subcarriers (carrier system bandwidth), subframes within the set of subcarriers are dedicated for either DL or UL, or may be TDD in which for a particular set of subcarriers (carrier system bandwidth), subframes within the set of subcarriers are dedicated for both DL and UL. In the examples provided by FIGS. 2A, 2C, the 5G/NR frame structure is assumed to be TDD, with subframe 4 being configured with slot format 28 (with mostly DL), where D is DL, U is UL, and X is flexible for use between DL/UL, and subframe 3 being configured with slot format 34 (with mostly UL). While subframes 3, 4 are shown with slot formats 34, 28, respectively, any particular subframe may be configured with any of the various available slot formats 0-61. Slot formats 0, 1 are all DL, UL, respectively. Other slot formats 2-61 include a mix of DL, UL, and flexible symbols. UEs are configured with the slot format (dynamically through DL control information (DCI), or semi-statically/statically through radio resource control (RRC) signaling) through a received slot format indicator (SFI). Note that the description infra applies also to a 5G/NR frame structure that is TDD.

Other wireless communication technologies may have a different frame structure and/or different channels. A frame (10 ms) may be divided into 10 equally sized subframes (1 ms). Each subframe may include one or more time slots. Subframes may also include mini-slots, which may include 7, 4, or 2 symbols. Each slot may include 7 or 14 symbols, depending on the slot configuration. For slot configuration 0, each slot may include 14 symbols, and for slot configuration 1, each slot may include 7 symbols. The symbols on DL may be cyclic prefix (CP) OFDM (CP-OFDM) symbols. The symbols on UL may be CP-OFDM symbols (for high throughput scenarios) or discrete Fourier transform (DFT) spread OFDM (DFT-s-OFDM) symbols (also referred to as single carrier frequency-division multiple access (SC-FDMA) symbols) (for power limited scenarios; limited to a single stream transmission). The number of slots within a subframe is based on the slot configuration and the numerology. For slot configuration 0, different numerologies $\mu$ 0 to 5 allow for 1, 2, 4, 8, 16, and 32 slots, respectively, per subframe. For slot configuration 1, different numerologies 0 to 2 allow for 2, 4, and 8 slots, respectively, per subframe. Accordingly, for slot configuration 0 and numerology $\mu$, there are 14 symbols/slot and $2^\mu$ slots/subframe. The subcarrier spacing and symbol length/duration are a function of the numerology. The subcarrier spacing may be equal to $2^\mu * 15$ kKz, where $\mu$ is the numerology 0 to 5. As such, the numerology $\mu=0$ has a subcarrier spacing of 15 kHz and the numerology $\mu=5$ has a subcarrier spacing of 480 kHz. The symbol length/duration is inversely related to the subcarrier spacing. FIGS. 2A-2D provide an example of slot configuration 0 with 14 symbols per slot and numerology $\mu=0$ with 1 slot per subframe. The subcarrier spacing is 15 kHz and symbol duration is approximately 66.7 µs.

A resource grid may be used to represent the frame structure. Each time slot includes a resource block (RB) (also referred to as physical RBs (PRBs)) that extends 12 consecutive subcarriers. The resource grid is divided into multiple resource elements (REs). The number of bits carried by each RE depends on the modulation scheme.

As illustrated in FIG. 2A, some of the REs carry reference (pilot) signals (RS) for the UE. The RS may include demodulation RS (DM-RS) (indicated as $R_x$ for one particular configuration, where 100x is the port number, but other DM-RS configurations are possible) and channel state information reference signals (CSI-RS) for channel estimation at the UE. The RS may also include beam measurement RS (BRS), beam refinement RS (BRRS), and phase tracking RS (PT-RS).

FIG. 2B illustrates an example of various DL channels within a subframe of a frame. The physical downlink control channel (PDCCH) carries DCI within one or more control channel elements (CCEs), each CCE including nine RE groups (REGs), each REG including four consecutive REs in an OFDM symbol. A primary synchronization signal (PSS) may be within symbol 2 of particular subframes of a frame. The PSS is used by a UE 104 to determine subframe/symbol timing and a physical layer identity. A secondary synchronization signal (SSS) may be within symbol 4 of particular subframes of a frame. The SSS is used by a UE to determine a physical layer cell identity group number and radio frame timing. Based on the physical layer identity and the physical layer cell identity group number, the UE can determine a physical cell identifier (PCI). Based on the PCI, the UE can determine the locations of the aforementioned DM-RS. The physical broadcast channel (PBCH), which carries a master information block (MIB), may be logically grouped with the PSS and SSS to form a synchronization signal (SS)/PBCH block. The MIB provides a number of RBs in the system bandwidth and a system frame number (SFN). The physical downlink shared channel (PDSCH) carries user data, broadcast system information not transmitted through the PBCH such as system information blocks (SIBs), and paging messages.

As illustrated in FIG. 2C, some of the REs carry DM-RS (indicated as R for one particular configuration, but other DM-RS configurations are possible) for channel estimation at the base station. The UE may transmit DM-RS for the physical uplink control channel (PUCCH) and DM-RS for the physical uplink shared channel (PUSCH). The PUSCH DM-RS may be transmitted in the first one or two symbols of the PUSCH. The PUCCH DM-RS may be transmitted in different configurations depending on whether short or long PUCCHs are transmitted and depending on the particular PUCCH format used. Although not shown, the UE may transmit sounding reference signals (SRS). The SRS may be used by a base station for channel quality estimation to enable frequency-dependent scheduling on the UL.

FIG. 2D illustrates an example of various UL channels within a subframe of a frame. The PUCCH may be located as indicated in one configuration. The PUCCH carries uplink control information (UCI), such as scheduling requests, a channel quality indicator (CQI), a precoding matrix indicator (PMI), a rank indicator (RI), and HARQ ACK/NACK feedback. The PUSCH carries data, and may additionally be used to carry a buffer status report (BSR), a power headroom report (PHR), and/or UCI.

Figure 3:
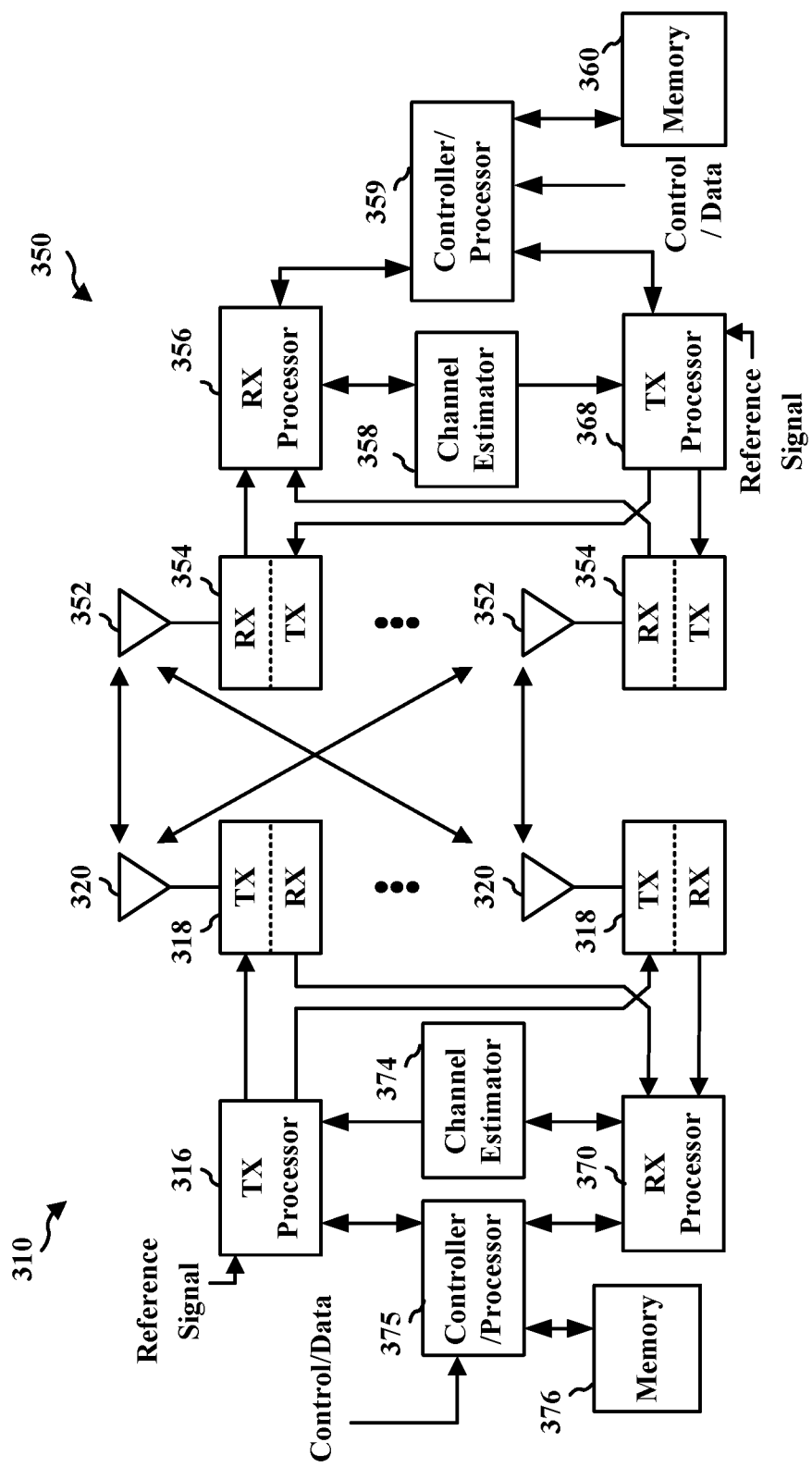
FIG. 3 is a diagram illustrating an example of a base station and user equipment (UE) in an access network.

FIG. 3 is a block diagram of a base station 310 in communication with a UE 350 in an access network. In the DL, IP packets from the EPC 160 may be provided to a controller/processor 375. The controller/processor 375 implements layer 3 and layer 2 functionality. Layer 3 includes a radio resource control (RRC) layer, and layer 2 includes a service data adaptation protocol (SDAP) layer, a packet data convergence protocol (PDCP) layer, a radio link control (RLC) layer, and a medium access control (MAC) layer. The controller/processor 375 provides RRC layer functionality associated with broadcasting of system information (e.g., MIB, SIBs), RRC connection control (e.g., RRC connection paging, RRC connection establishment, RRC connection modification, and RRC connection release), inter radio access technology (RAT) mobility, and measurement configuration for UE measurement reporting; PDCP layer functionality associated with header compression/decompression, security (ciphering, deciphering, integrity protection, integrity verification), and handover support functions; RLC layer functionality associated with the transfer of upper layer packet data units (PDUs), error correction through ARQ, concatenation, segmentation, and reassembly of RLC service data units (SDUs), re-segmentation of RLC data PDUs, and reordering of RLC data PDUs; and MAC layer functionality associated with mapping between logical channels and transport channels, multiplexing of MAC SDUs onto transport blocks (TBs), demultiplexing of MAC SDUs from TBs, scheduling information reporting, error correction through HARQ, priority handling, and logical channel prioritization.

The transmit (TX) processor 316 and the receive (RX) processor 370 implement layer 1 functionality associated with various signal processing functions. Layer 1, which includes a physical (PHY) layer, may include error detection on the transport channels, forward error correction (FEC) coding/decoding of the transport channels, interleaving, rate matching, mapping onto physical channels, modulation/demodulation of physical channels, and MIMO antenna processing. The TX processor 316 handles mapping to signal constellations based on various modulation schemes (e.g., binary phase-shift keying (BPSK), quadrature phase-shift keying (QPSK), M-phase-shift keying (M-PSK), M-quadrature amplitude modulation (M-QAM)). The coded and modulated symbols may then be split into parallel streams. Each stream may then be mapped to an OFDM subcarrier, multiplexed with a reference signal (e.g., pilot) in the time and/or frequency domain, and then combined together using an Inverse Fast Fourier Transform (IFFT) to produce a physical channel carrying a time domain OFDM symbol stream. The OFDM stream is spatially precoded to produce multiple spatial streams. Channel estimates from a channel estimator 374 may be used to determine the coding and modulation scheme, as well as for spatial processing. The channel estimate may be derived from a reference signal and/or channel condition feedback transmitted by the UE 350. Each spatial stream may then be provided to a different antenna 320 via a separate transmitter 318TX. Each transmitter 318TX may modulate an RF carrier with a respective spatial stream for transmission.

At the UE 350, each receiver 354RX receives a signal through its respective antenna 352. Each receiver 354RX recovers information modulated onto an RF carrier and provides the information to the receive (RX) processor 356. The TX processor 368 and the RX processor 356 implement layer 1 functionality associated with various signal processing functions. The RX processor 356 may perform spatial processing on the information to recover any spatial streams destined for the UE 350. If multiple spatial streams are destined for the UE 350, they may be combined by the RX processor 356 into a single OFDM symbol stream. The RX processor 356 then converts the OFDM symbol stream from the time-domain to the frequency domain using a Fast Fourier Transform (FFT). The frequency domain signal comprises a separate OFDM symbol stream for each subcarrier of the OFDM signal. The symbols on each subcarrier, and the reference signal, are recovered and demodulated by determining the most likely signal constellation points transmitted by the base station 310. These soft decisions may be based on channel estimates computed by the channel estimator 358. The soft decisions are then decoded and deinterleaved to recover the data and control signals that were originally transmitted by the base station 310 on the physical channel. The data and control signals are then provided to the controller/processor 359, which implements layer 3 and layer 2 functionality.

The controller/processor 359 can be associated with a memory 360 that stores program codes and data. The memory 360 may be referred to as a computer-readable medium. In the UL, the controller/processor 359 provides demultiplexing between transport and logical channels, packet reassembly, deciphering, header decompression, and control signal processing to recover IP packets from the EPC 160. The controller/processor 359 is also responsible for error detection using an ACK and/or NACK protocol to support HARQ operations.

Similar to the functionality described in connection with the DL transmission by the base station 310, the controller/processor 359 provides RRC layer functionality associated with system information (e.g., MIB, SIBs) acquisition, RRC connections, and measurement reporting; PDCP layer functionality associated with header compression/decompression, and security (ciphering, deciphering, integrity protection, integrity verification); RLC layer functionality associated with the transfer of upper layer PDUs, error correction through ARQ, concatenation, segmentation, and reassembly of RLC SDUs, re-segmentation of RLC data PDUs, and reordering of RLC data PDUs; and MAC layer functionality associated with mapping between logical channels and transport channels, multiplexing of MAC SDUs onto TBs, demultiplexing of MAC SDUs from TBs, scheduling information reporting, error correction through HARQ, priority handling, and logical channel prioritization.

Channel estimates derived by a channel estimator 358 from a reference signal or feedback transmitted by the base station 310 may be used by the TX processor 368 to select the appropriate coding and modulation schemes, and to facilitate spatial processing. The spatial streams generated by the TX processor 368 may be provided to different antenna 352 via separate transmitters 354TX. Each transmitter 354TX may modulate an RF carrier with a respective spatial stream for transmission.

The UL transmission is processed at the base station 310 in a manner similar to that described in connection with the receiver function at the UE 350. Each receiver 318RX receives a signal through its respective antenna 320. Each receiver 318RX recovers information modulated onto an RF carrier and provides the information to a RX processor 370.

The controller/processor 375 can be associated with a memory 376 that stores program codes and data. The memory 376 may be referred to as a computer-readable medium. In the UL, the controller/processor 375 provides demultiplexing between transport and logical channels, packet reassembly, deciphering, header decompression, control signal processing to recover IP packets from the UE 350. IP packets from the controller/processor 375 may be provided to the EPC 160. The controller/processor 375 is also responsible for error detection using an ACK and/or NACK protocol to support HARQ operations.

In various wireless communications system, a transmitter may include various nonlinear components, such as high power amplifiers with limit linear dynamic range. Some nonlinear components may distort a transmitted signal due to high peak to average power ratio (PAPR). In order to reduce this distortion, a back off may be applied (e.g., to the transmission power). However, the back off may reduce power efficiency.

The efficiency of radiated power may be influential in the design of a radio frequency (RF) transmitter. In order to improve efficiency, at least one DPD and/or at least one DPoD operation(s) may be performed based on non-linearity estimations from the transmission of the signal. For example, a transmitter may apply at least one DPD operation and/or a receiver may apply at least one DPoD operation. In order perform at least one DPD operation and/or at least one DPoD operation, the non-linearity characteristics of various components in the transmitter and/or the receiver (e.g., amplifiers, signal converters, etc.) may be estimated.

The present disclosure may provide approaches to estimation of nonlinearity characteristics of various components of the transmitter and/or receiver. Various approaches described herein may avoid data-driven nonlinearity estimation, which may use iterative decoding for signals having a relatively high signal-to-noise ratio (SNR) and with a modulation scheme of 16 quadrature amplitude modulation (QAM) or a higher modulation scheme. In various approaches, various portions of a transmitted signal may be used for nonlinearity estimation, such as a preamble. The dynamic range of a transmitted reference signal may be modified using non-constant envelope constellations in order to cover many (potentially all) dynamic ranges of nonlinear components. Some approaches described in the present disclosure may differ from some protocols, which may use signal preambles with a constant (or approximately constant, due to some shaping pulse) envelope in order to avoid nonlinearity effects (e.g., for a high-power amplifier). Signal preambles with a constant (or nearly constant) envelope may prevent nonlinearity estimation by a receiver.

Figure 4:
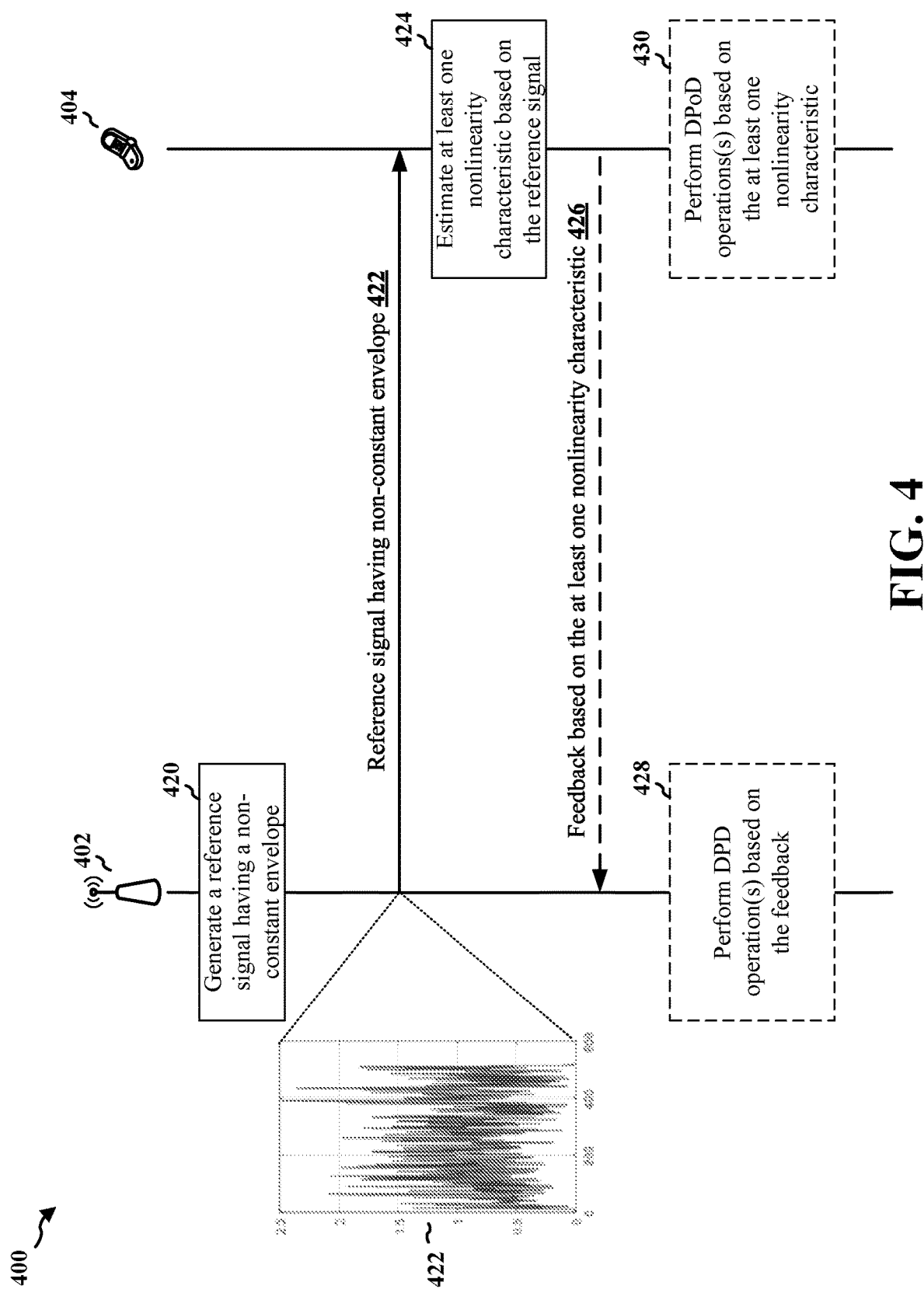
FIG. 4 is a call flow diagram of a wireless communications system.

FIG. 4 is a call flow diagram of a wireless communications system 400. The wireless communications system 400 may include at least one transmitter 402 and at least one receiver 404. The transmitter 402 and the receiver 404 are illustrated as a base station and a UE, respectively (e.g., for uplink communication); however, this arrangement is to be regarded as illustrative and the transmitter 402 and/or the receiver 404 may be any apparatuses configured for wireless communication.

The transmitter 402 and the receiver 404 may be configured to communicate on one or more channels according to at least one standard. For example, the transmitter 402 and the receiver 404 may be configured to communicate according to one or more 3GPP standards (e.g., 5G NR, LTE, etc.). In another example, the transmitter 402 and the receiver 404 may be configured to communicate according to one or more IEEE standards (e.g., 802.11). The aforementioned examples are intended to be illustrative, and the aspects described herein may be applicable to any standard and/or protocol for wireless communication.

In order to improve communication between the transmitter 402 and the receiver 404, it may be beneficial to estimate one or more nonlinearity characteristics (or coefficients) associated with the transmitter/receiver path (e.g., channel). Estimation of the one or more nonlinearity characteristics may allow the transmitter 402 to perform at least one DPD operation based on feedback from the receiver 404 and/or may allow the receiver 404 to perform at least one DPoD operation based on the estimation of the one or more nonlinearity characteristics by the receiver 404. In so performing at least one DPD operation and/or at least one DPoD operation, the transmitter 402 and/or the receiver 404 may improve throughput, capacity, and/or response of a channel while also improving efficiency of radiated power.

The transmitter 402 may include one or more nonlinear components, for example, as part of the transmit chain corresponding to generation of signals for transmission. Examples of such nonlinear components include a high-power amplifier (HPA) (e.g., an HPA with limited linear dynamic range), a digital-to-analog converter (DAC), and so forth. The nonlinear components may distort signals transmitted by the transmitter 402—e.g., an HPA with limited linear dynamic range may distort transmitted signals due to a relatively high peak-to-average-power ratio (PAPR).

Complementary to the transmit chain, the receiver 404 may include a receive chain. The receive chain may include one or more nonlinear components. Examples of such nonlinear components include a low-noise amplifier (LNA), an analog-to-digital converter (ADC), and so forth.

Such nonlinear components may be adjusted before transmission (e.g., at least one DPD operation by the transmitter 402) and/or after reception (e.g., at least one DPoD operation by the receiver 404), e.g., by adjusting one or more coefficients of one or more nonlinear components in order to reduce or cancel distortion. In order to reduce or cancel the distortion through at least one DPD operation and/or at least one DPoD operation, the receiver 404 may determine (e.g., estimate) one or more nonlinearity characteristics based on a signal having a non-constant envelope from the transmitter 402.

According to aspects, the transmitter 402 may generate 420 a reference signal 422 having a non-constant envelope for nonlinearity estimation by the receiver 404. In aspects, an envelope of a signal may outline variation of amplitude (e.g., over a period of time). A signal having a constant envelope may have an approximately constant amplitude, e.g., so that the absolute value of the signal is approximately one (1). Consequently, a signal having a non-constant envelope may be a signal that may not have an approximately constant amplitude, e.g., so that the absolute value of the signal is not approximately one (1). For example, the transmitter 402 may refrain from attempting to constrain the absolute value of the reference signal 422 to approximately one (1), which may result in the reference signal 422 having a non-constant envelope.

In one aspect, the transmitter 402 may set the modulation of the reference signal 422 to have a relatively higher dynamic range (e.g., a higher dynamic range relative to a signal modulated to have a dynamic range corresponding to a constant envelope). For example, the transmitter 402 may set the modulation of the reference signal 422 to have the highest possible dynamic range achievable by the transmit chain (e.g., HPA, DAC, etc.), which may enable the receiver 404 to estimate an approximately full set of nonlinearity characteristic(s).

By way of example, the reference signal 422 may be illustrated as a plurality of samples as shown in FIG. 4. In one aspect, the transmitter 402 may modulate the reference signal 422 using QAM. For example, the reference signal 422 may be a 16 QAM constellation, a 64 QAM constellation, a 256 QAM constellation, and so forth (n.b., the reference signal 422 may be a constellation of any order QAM, and the preceding 16, 64, and 256 orders are to be regarded as illustrative). In another aspect, the transmitter 402 may modulate the reference signal 422 using another modulation scheme.

In one example, the reference signal 422 may include at least a portion of a downlink signal or an uplink signal (e.g., the reference signal 422 may be included as part of a frame, subframe, or another transmission time interval (TTI)). In one example, the reference signal 422 may include an individual signal (e.g., the reference signal 422 may include an individual burst of bursty communication). In one example, the reference signal 422 may include a single-carrier signal.

In various aspects, the reference signal 422 may include a known reference signal, e.g., as defined in one or more standards and/or protocols for wireless communication. For example, a known reference signal may be modulated using phase-shift keying according to one or more standards and/or protocols, such as binary phase-shift keying (BPSK). However, as indicated supra, the transmitter 402 may modulate the reference signal 422 so that the reference signal 422 has a non-constant envelope. Thus, while the reference signal 422 may be known, the reference signal 422 may not have a constant envelope (e.g., the reference signal 422 would otherwise have a constant envelope when defined by one or more known standards and/or protocols). In some aspects, the reference signal 422 having the non-constant envelope may have the approximately the same average power as a known reference signal having a constant envelope.

In one example, the reference signal 422 may include a preamble that begins a signal. In one example, the reference signal 422 may be another part of a signal besides the preamble, such as a guard period (GP) or guard interval (GI). In one example, the reference signal 422 may include a pilot signal (e.g., LTE pilot signal, 5G pilot signal, WiFi pilot signal, etc.). In one example, the reference signal 422 may include a preamble having the non-constant envelope, and the non-constant envelope may be absent from a second portion of the reference signal 422 that is separate from the preamble.

In the context of IEEE standard(s), including 802.11, the reference signal 422 may include a short training sequence (STS), channel estimation sequence (CES), GI (e.g., for 802.11.ad/802.11.ay), or another sequence. In the context of 3GPP standard(s), including 5G and/or LTE, the reference signal 422 may include a synchronization signal (e.g., PSS), a Zadoff-Chu sequence, or another sequence.

As illustrated in FIG. 4, the transmitter 402 may transmit the reference signal 422 for nonlinearity estimation by the receiver 404. The receiver 404 may receive the reference signal 422 having the non-constant envelope.

Because the reference signal 422 may be defined by one or more standards and/or protocols, the reference signal 422 may be known by the receiver 404. Upon reception, the receiver 404 may estimate 424 one or more nonlinearity characteristics (e.g., coefficients) based on the reference signal 422 having the non-constant envelope.

In one aspect, the receiver 404 may estimate 424 the one or more nonlinearity characteristics based on an algorithm that employs the least squares method. By way of example, the receiver 404 may estimate the nonlinearity characteristic(s) as $k_{NL}=(x_{NL}{}^H x_{NL})^{-1} x_{NL}{}^H y$. In the preceding equation, x may denote the transmitted reference signal 422 having the non-constant envelope. Correspondingly, y may denote the received reference signal 422, which may be modeled as $y=k_{NL}x_{NL}+n$ (where n is noise). The nonlinearity kernels may be denoted as $x_{NL}=[x, x|x|^2, x|x|^4]^H$ (although any order of nonlinearity estimation can be achieved by adding additional kernels). The nonlinearity coefficients to be estimated may be denoted as $k_{NL}=[k_1, k_3, k_5]$. Therefore, as shown supra, the receiver 404 may estimate 424 nonlinearity characteristic(s) or coefficient(s) as $k_{NL}=(x_{NL}{}^H x_{NL})^{-1} x_{NL}{}^H y$. The preceding examples are to be regarded as illustrative and, therefore, the receiver 404 may employ any suitable algorithm(s) in order to estimate 424 the one or more nonlinearity characteristic(s).

Based on estimation 424 of the one or more nonlinearity characteristic(s), the receiver 404 may perform one or more operations in order to reduce (or cancel) nonlinearity by at least one of the transmitter 402 and/or the receiver 404.

In one aspect, the receiver 404 may generate feedback 426 that indicates at least one of the one or more nonlinearity characteristics. For example, the receiver 404 may identify the non-constant envelope of the reference signal 422, which may include identifying or detecting distortion present in the reference signal 422. The receiver 404 may generate the feedback 426 to indicate the non-constant envelope (e.g., to indicate distortion present in the received reference signal 422). The receiver 404 may transmit the generated feedback 426 to the transmitter 402.

Responsively, the transmitter 402 may attempt to reduce (e.g., cancel) nonlinearity based on the received feedback 426. For example, the transmitter 402 may identify the non-constant envelope (e.g., distortion in the reference signal 422 received by the receiver 404) indicated by the feedback 426, and the transmitter 402 may perform one or more operations to improve reduce distortion of transmitted signals based on the non-constant envelope indicated by the feedback 426. The transmitter 402 may perform 428 at least one DPD operation based on the feedback 426. In one example, the transmitter 402 may adjust one or more coefficients or parameters of one or more components of the transmit chain of the transmitter 402. For example, the transmitter 402 may adjust one or more coefficients associated with at least one of an HPA and/or a DAC based on the received feedback 426.

In one aspect, the receiver 404 may attempt to reduce (e.g., cancel) nonlinearity based on the estimated nonlinearity characteristic(s). For example, the receiver 404 may perform 430 at least one DPoD operation based on the estimated nonlinearity characteristic(s). In one example, the receiver 404 may adjust one or more coefficients or parameters of one or more components of the receive chain of the receiver 404. For example, the receiver 404 may adjust one or more coefficients associated with at least one of an LNA and/or an ADC based on the estimated nonlinearity characteristic(s).

In one aspect, the receiver 404 and transmitter 402 may attempt to reduce (e.g., cancel) nonlinearity at both the receiver 404 and the transmitter 402. Accordingly, the receiver 404 may both transmit the feedback 426 based on the nonlinearity characteristic(s) so that the transmitter 402 may perform 428 at least one DPD operation based on the feedback 426, and may perform 430 at least one DPoD operation based on the nonlinearity characteristic(s).

With the operations described supra, nonlinearity may be reduced or canceled. The reduction or cancellation of nonlinearity may improve communication between the transmitter 402 and the receiver 404, e.g., by improving throughput, capacity, and/or response of at least one channel on which the transmitter 402 and the receiver 404 communicate in the wireless communications system 400.

This approach to reduction or cancellation of nonlinearity may reduce the overhead commensurate with existing approaches to nonlinearity reduction or cancellation. For example, existing approaches to nonlinearity reduction or cancellation may be data-driven, may involve iterative decoding, may be effective only for a relatively high SNR, and may be possible only for QAM modulation of an order that is sixteen (16) or higher. Advantageously, operations for nonlinearity reduction or cancellation as described herein may be more power efficient, less computationally expensive (e.g., less complex, reduce or remove iterative decoding, etc.), more robust (e.g., effective for a larger SNR range, effective for more and/or other order modulation schemes, etc.), and/or faster than existing approaches to nonlinearity reduction or cancellation.

Figure 5:
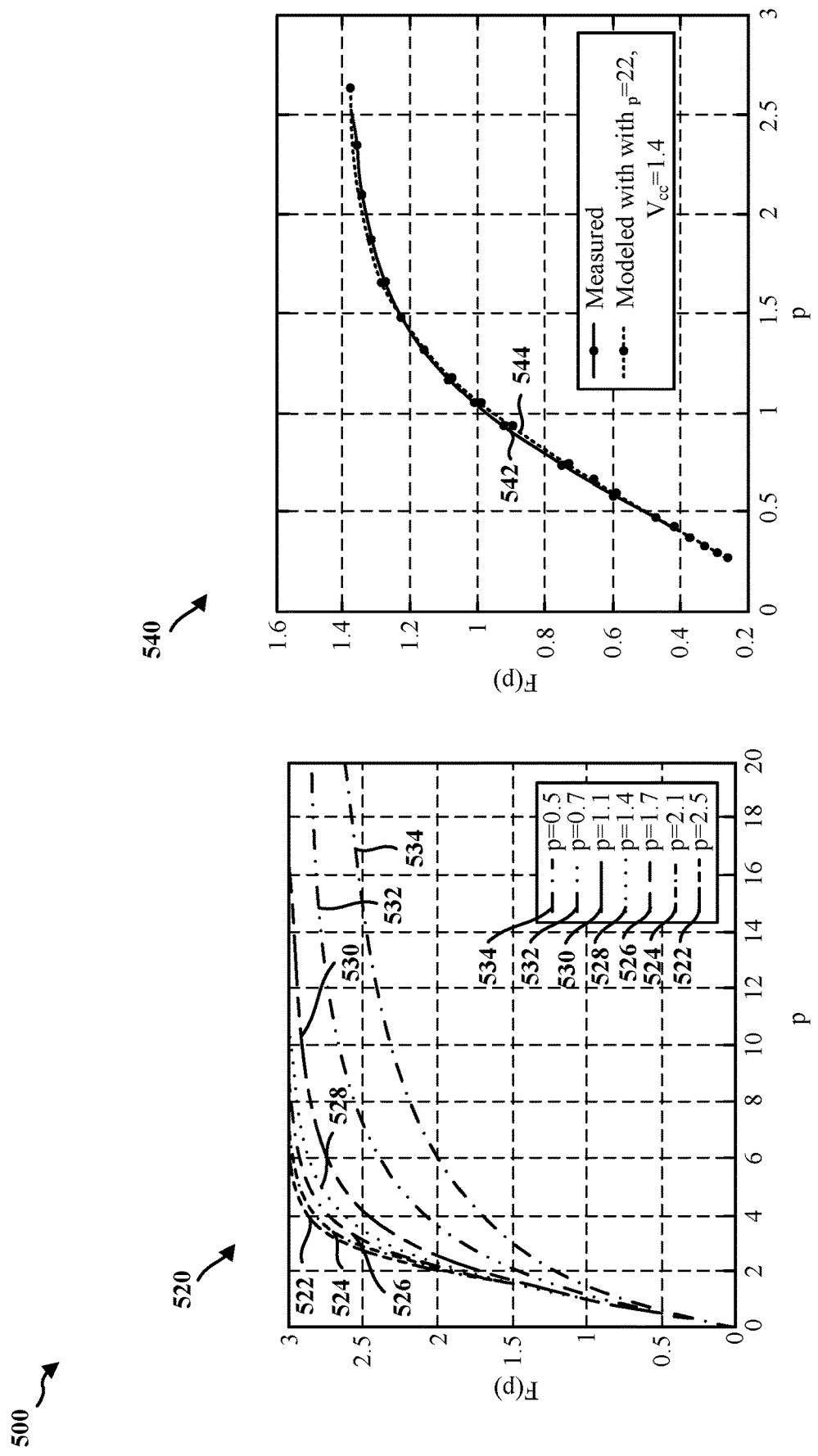
FIG. 5 is a diagram of a model of characteristics that may contribute to nonlinearity.

FIG. 5 is a diagram of a HPA characteristics 500, modeled using two (2) parameters. In FIG. 5, amplitude-to-amplitude (AM/AM) modeling of a memoryless HPA is illustrated, using feedback of a sharpness factor, and similar modeling may be done for amplitude-to-phase (AM/PM).

$$F(\rho) = \frac{\rho}{\left(1 + \left(\frac{\rho}{V_{cc}}\right)^{2\rho}\right)^{\frac{1}{2\rho}}}$$

$$V_{cc} = \sqrt{P_{sat}}$$

In aspects, $\rho$ may denote a coefficient, such as a voltage coefficient. In one example, $\rho$ may be a coefficient adjusted by the transmitter 402 in the transmit chain (e.g., a coefficient of an HPA), e.g., in order to reduce or cancel nonlinearity. $P_{sat}$ may denote power, e.g., when an HPA is saturated. $V_{cc}$ may denote voltage (e.g., power supply voltage, which may be positive). Accordingly, $F(\rho)$ may denote the output of a component of a transmit chain of the transmitter 402, such as an HPA.

In FIG. 5, a first graph 520 illustrates an example for a solid state power amplifier (SSPA) AM/AM model with $V_{cc}=3$. A first curve 522 illustrates $\rho=2.5$. A second curve 524 illustrates $\rho=2.1$. A third curve 526 illustrates $\rho=1.7$. A fourth curve 528 illustrates $\rho=1.4$. A fifth curve 530 illustrates $\rho=1.1$. A sixth curve 532 illustrates $\rho=0.7$. A seventh curve 534 illustrates $\rho=0.5$.

A second graph 540 illustrates an example of an AM/AM model that may be measured. A measured curve 542 may illustrate a measured $F(\rho)$. A modeled curve 544 may illustrate a modeled $F(\rho)$, with $\rho=2.2$ and $V_{cc}=1.4$. As illustrated, the modeled curve 544 approximates the measured curve 542.

Figure 6:
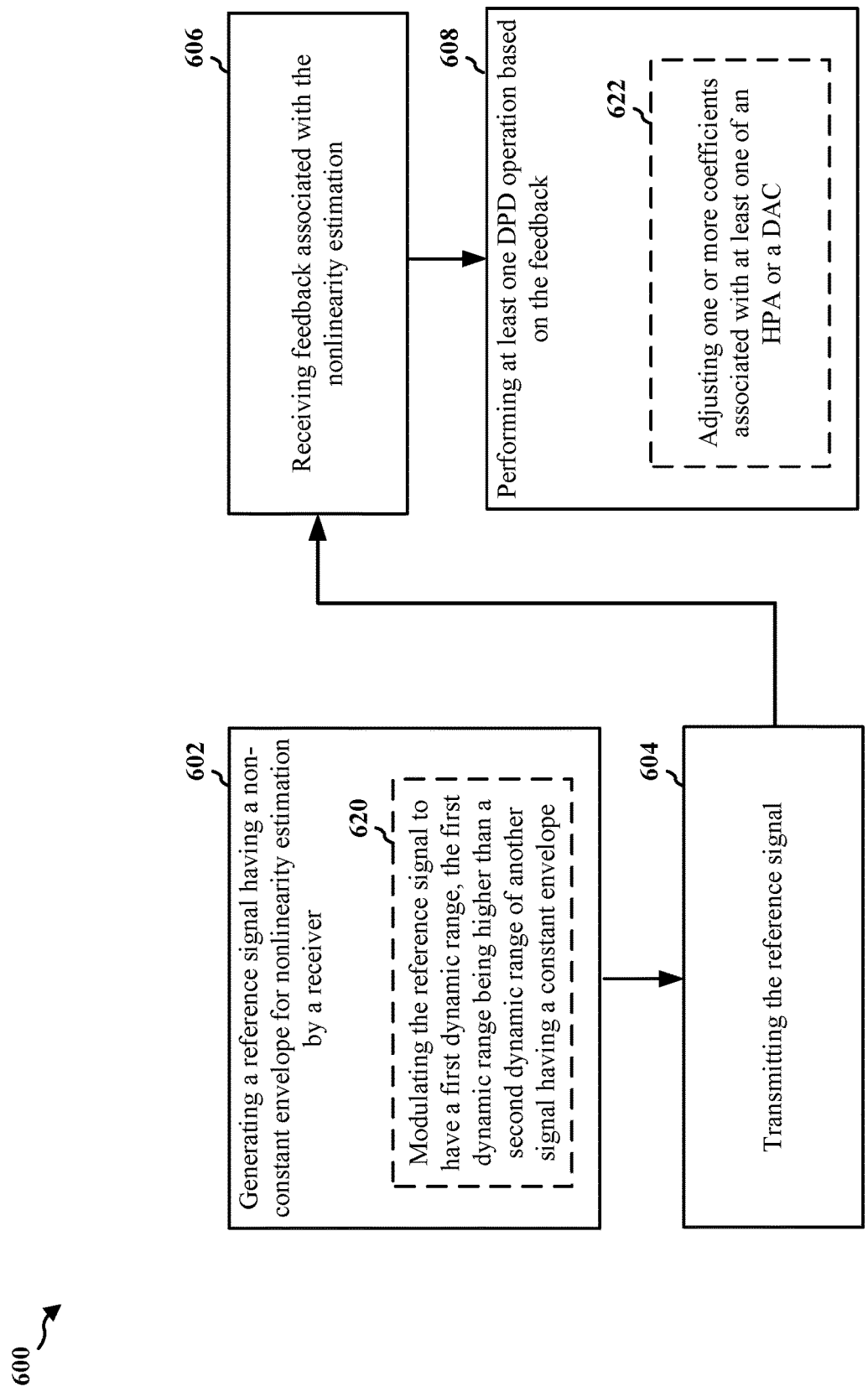
FIG. 6 is a flowchart of a method of wireless communication.

FIG. 6 is a flowchart illustrating a method 600 of wireless communication, in accordance with various aspects of the present disclosure. The method 600 may be implemented by a transmitter, such as the transmitter 402 of FIG. 4, the base station 310 of FIG. 3, and/or the base station 180 of FIG. 1. In various aspects, one or more operations may be optional (e.g., as denoted by dashed lines). Further, one or more operations may be omitted, transposed, and/or contemporaneously performed.

Beginning at operation 602, the transmitter may generate a reference signal having a non-constant envelope for nonlinearity estimation by a receiver. In one aspect, the reference signal may include a PSS. In one aspect, the reference signal may be based on a sequence, such as a Zadoff-Chu sequence. In one aspect, the reference signal may include at least one of an STS or a GI. In an aspect, the reference signal includes a preamble having the non-constant envelope, and the non-constant envelope may be absent from a second portion of the reference signal that is separate from the preamble. In the context of FIG. 4, the transmitter 402 may generate the reference signal 422 having a non-constant envelope for nonlinearity estimation by the receiver 404.

In one aspect, operation 602 includes operation 620. At operation 620, the transmitter may modulate the reference signal to have a first dynamic range, and the first dynamic range may be relatively higher than a second dynamic range of another signal having a constant envelope. For example, the second dynamic range may correspond to the dynamic range of a known reference signal having a constant envelope. In the context of FIG. 4, the transmitter 402 may modulate the reference signal 422 to have a first dynamic range, which may be relatively higher than a second dynamic range of another reference signal having a constant envelope.

At operation 604, the transmitter may transmit the reference signal. In one aspect, the transmitter may broadcast the reference signal. In another aspect, the transmitter may unicast or multicast the reference signal to the receiver. In the context of FIG. 4, the transmitter 402 may transmit the reference signal 422.

At operation 606, the transmitter may receive, from the receiver, feedback associated with the nonlinearity estimation. For example, the feedback may indicate one or more nonlinearity characteristics or coefficients estimated by the receiver based on the reference signal having the non-constant envelope. In the context of FIG. 4, the transmitter 402 may receive, from the receiver 404, the feedback 426 associated with the estimation 424 of the one or more nonlinearity characteristics by the receiver 404.

At operation 608, the transmitter may perform at least one DPD operation based on the received feedback. In one aspect, the at least one DPD operation may include an algorithm that is to be applied to one or more components (e.g., RF frontend components). For example, transmitter may identify one or more coefficients associated with a component of the transmitter. The component may include, e.g., an amplifier, a converter, or another component that may affect, transform, adjust, etc. a signal that is to be transmitted. The transmitter may apply a DPD algorithm in order to reduce distortion introduced to the signal by the component, reduce nonlinearity of the component, and/or otherwise improve signal fidelity during signal transmission. In application of the algorithm, the transmitter may calculate one or more coefficients of the component that may affect the signal. The calculated coefficients may be used for transmission of one or more signals, e.g., after the signal having the non-constant envelope. In the context of FIG. 4, the transmitter 402 may perform 428 at least one DPD operation based on the received feedback 426.

In one aspect, operation 608 includes operation 622. At operation 622, the transmitter may adjust one or more coefficients associated with one or more components of the transmit chain of the transmitter. For example, the transmitter may identify at least one coefficient of an HPA and/or a DAC that contributes to the nonlinearity based on the feedback, and the transmitter may set the at least one coefficient to a value based on the received feedback in order to reduce or cancel nonlinearity (e.g., in order to improve signal fidelity). In the context of FIG. 4, the transmitter 402 may adjust one or more coefficients associated with at least one of an HPA or a DAC based on the received feedback 426.

Figure 7:
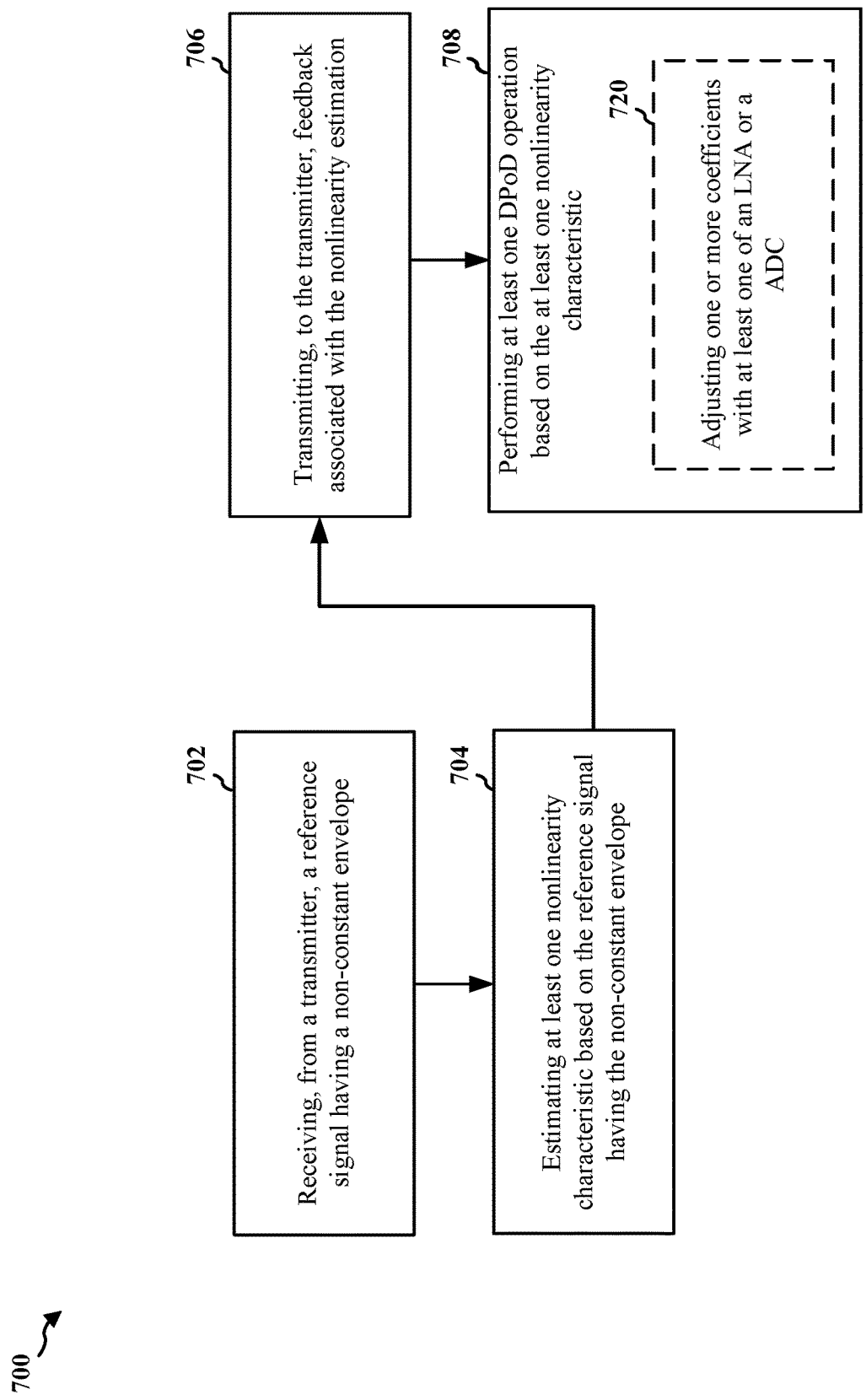
FIG. 7 is a flowchart of a method of wireless communication.

FIG. 7 is a flowchart illustrating a method 700 of wireless communication, in accordance with various aspects of the present disclosure. The method 700 may be implemented by a receiver, such as the receiver 404 of FIG. 4, the UE 350 of FIG. 3, and/or the UE 104 of FIG. 1. In various aspects, one or more operations may be optional (e.g., as denoted by dashed lines). Further, one or more operations may be omitted, transposed, and/or contemporaneously performed.

Beginning with operation 702, the receiver may receive a reference signal having a non-constant envelope. In one aspect, the reference signal may include a PSS. In one aspect, the reference signal may be based on a sequence, such as a Zadoff-Chu sequence. In one aspect, the reference signal may include at least one of an STS or a GI. In an aspect, the reference signal includes a preamble having the non-constant envelope, and the non-constant envelope may be absent from a second portion of the reference signal that is separate from the preamble. In the context of FIG. 4, the receiver 404 may receive the reference signal 422 from the transmitter 402.

At operation 704, the receiver may estimate at least one nonlinearity characteristic based on the reference signal having the non-constant envelope. In one aspect, the receiver may estimate the at least one nonlinearity characteristic using an algorithm that is based on a least squares method. In the context of FIG. 4, the receiver 404 may estimate 424 at least one nonlinearity characteristic based on the reference signal 422 having the non-constant envelope.

At operation 706, the receiver may transmit, to the transmitter, feedback based on the at least one nonlinearity characteristic. For example, the receiver may select one or more values indicative of the one or more nonlinearity characteristics, and the receiver may include the one or more values in a message to be transmitted to the transmitter so that the transmitter may perform at least one DPD operation to reduce or cancel nonlinearity. In the context of FIG. 4, the receiver 404 may transmit, to the transmitter 402, the feedback 426 that is based on the estimation 424 of the one or more nonlinearity characteristics.

At operation 708, the receiver may perform at least one DPoD operation based on the at least one nonlinearity characteristic estimated by the receiver. In one aspect, the at least one DPoD operation may include an algorithm that is to be applied to one or more components (e.g., RF frontend components). For example, receiver may identify one or more coefficients associated with a component of the receiver. The component may include, e.g., an amplifier, a converter, or another component that may affect, transform, adjust, etc. a signal that is to be received. The receiver may apply a DPoD algorithm in order to reduce distortion introduced to the signal by the component, reduce nonlinearity of the component, and/or otherwise improve signal fidelity during signal reception. In application of the algorithm, the receiver may calculate one or more coefficients of the component that may affect the signal. The calculated coefficients may be used for reception of one or more signals, e.g., after the signal having the non-constant envelope. In the context of FIG. 4, the receiver 404 may perform 430 at least one DPoD operation based on the estimation 424 of the at least one nonlinearity characteristic.

In one aspect, operation 708 includes operation 720. At operation 720, the receiver may adjust one or more coefficients associated with one or more components of the receive chain of the receiver. For example, the receiver may identify at least one coefficient of an LNA and/or an ADC that contributes to the nonlinearity based on the estimated nonlinearity characteristic(s), and the receiver may set the at least one coefficient to a value based on the estimated nonlinearity characteristic(s) in order to reduce or cancel nonlinearity. In the context of FIG. 4, the receiver 404 may adjust one or more coefficients associated with at least one of an LNA or an ADC based on the estimated nonlinearity characteristic(s).

As described, supra, the receiver may perform at least one of operation 706 and operation 708. Accordingly, at least one of the transmitter or the receiver may attempt to reduce or cancel nonlinearity by performing at least one DPD operation and/or at least one DPoD operation, respectively. Thus, in one aspect, operation 706 may be performed and operation 708 may be omitted. In another aspect, operation 706 may be omitted and operation 708 may be performed. In a third aspect, both operation 706 and operation 708 may be performed (n.b., operation 706 and operation 708 may be transposed in one aspect).

Figure 8:
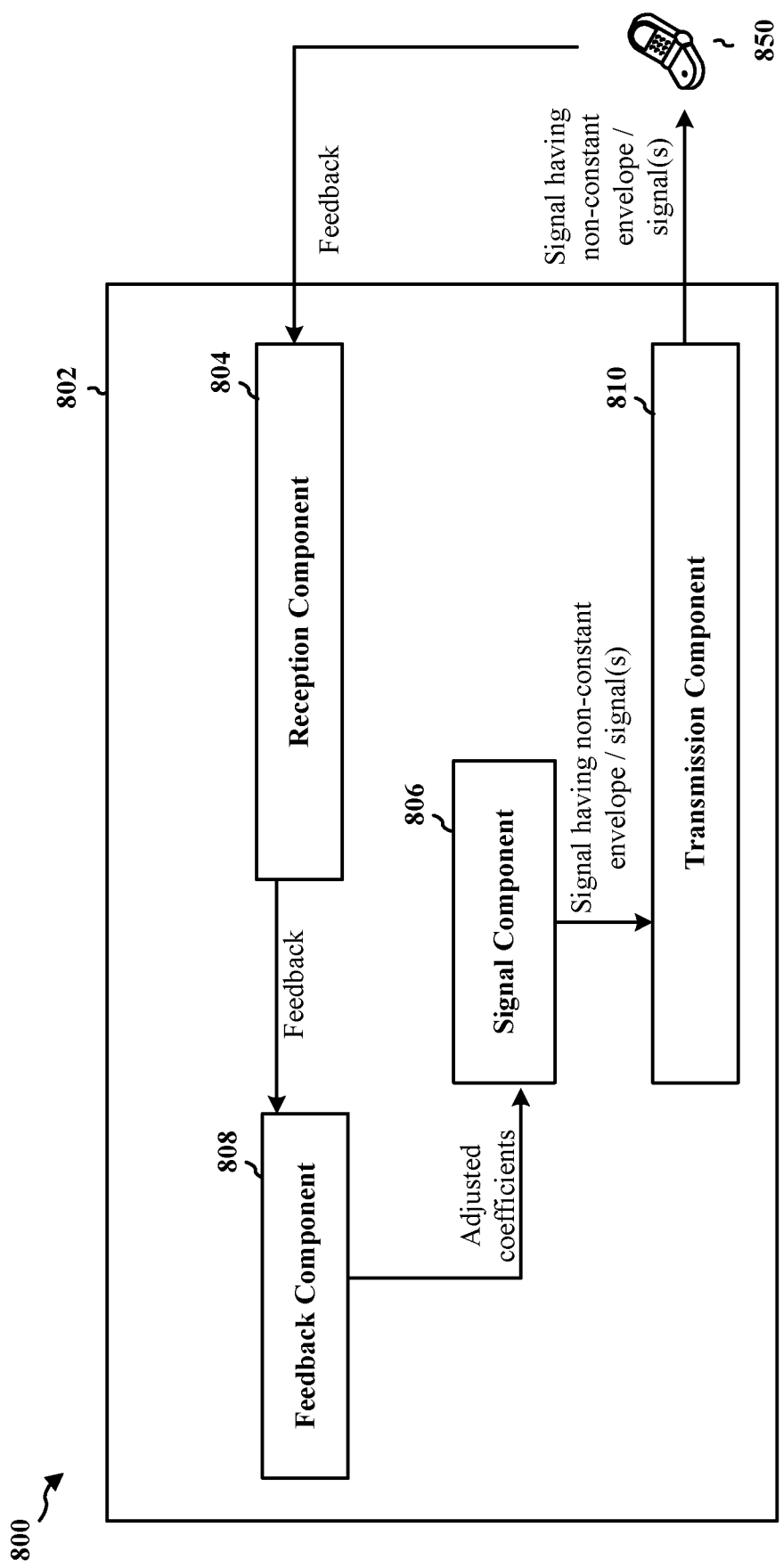
FIG. 8 is a conceptual data flow diagram illustrating the data flow between different means/components in an exemplary apparatus.

FIG. 8 is a conceptual data flow diagram 800 illustrating the data flow between different means/components in an exemplary apparatus 802. The apparatus may be a transmitter, such as a base station. The apparatus 802 includes a reception component 804 for receiving signals from a UE 850. The apparatus 802 includes a transmission component 810 for transmitting signals to the UE 850.

A signal component 806 may generate a reference signal having a non-constant envelope. The signal may be generated for nonlinearity estimation by the UE 850. In one aspect, the reference signal may include a PSS. In one aspect, the PSS may be based on a Zadoff-Chu sequence. The signal component 806 may generate the reference signal to include one of a STS and/or a GI. The signal component 806 may generate the reference signal so that the non-constant envelope is applied to a preamble of the reference signal.

The signal component 806 may generate the reference signal to have the non-constant envelope by modulating the reference signal to have a first dynamic range. The first dynamic range may be higher than a second dynamic range of another signal having a constant envelope, which may also be generated by the signal component 806.

The signal component 806 may provide the reference signal to the transmission component 810 for transmission to the UE 850. The UE 850 may receive the signal, and the UE 850 may transmit feedback associated with nonlinearity estimation based on the reference signal.

The reception component 804 may receive the feedback and provide the feedback to the feedback component 808. The feedback component 808 may perform at least one DPD operation based on the received feedback. For example, the feedback component 808 may adjust one or more coefficients associated with at least one of an HPA and/or a DAC of the apparatus 802. The adjusted coefficients may be used for the transmission of additional signals.

The apparatus may include additional components that perform each of the blocks of the algorithm in the aforementioned flowcharts of FIG. 6. As such, each block in the aforementioned flowcharts of FIG. 6 may be performed by a component and the apparatus may include one or more of those components. The components may be one or more hardware components specifically configured to carry out the stated processes/algorithm, implemented by a processor configured to perform the stated processes/algorithm, stored within a computer-readable medium for implementation by a processor, or some combination thereof.

Figure 9:
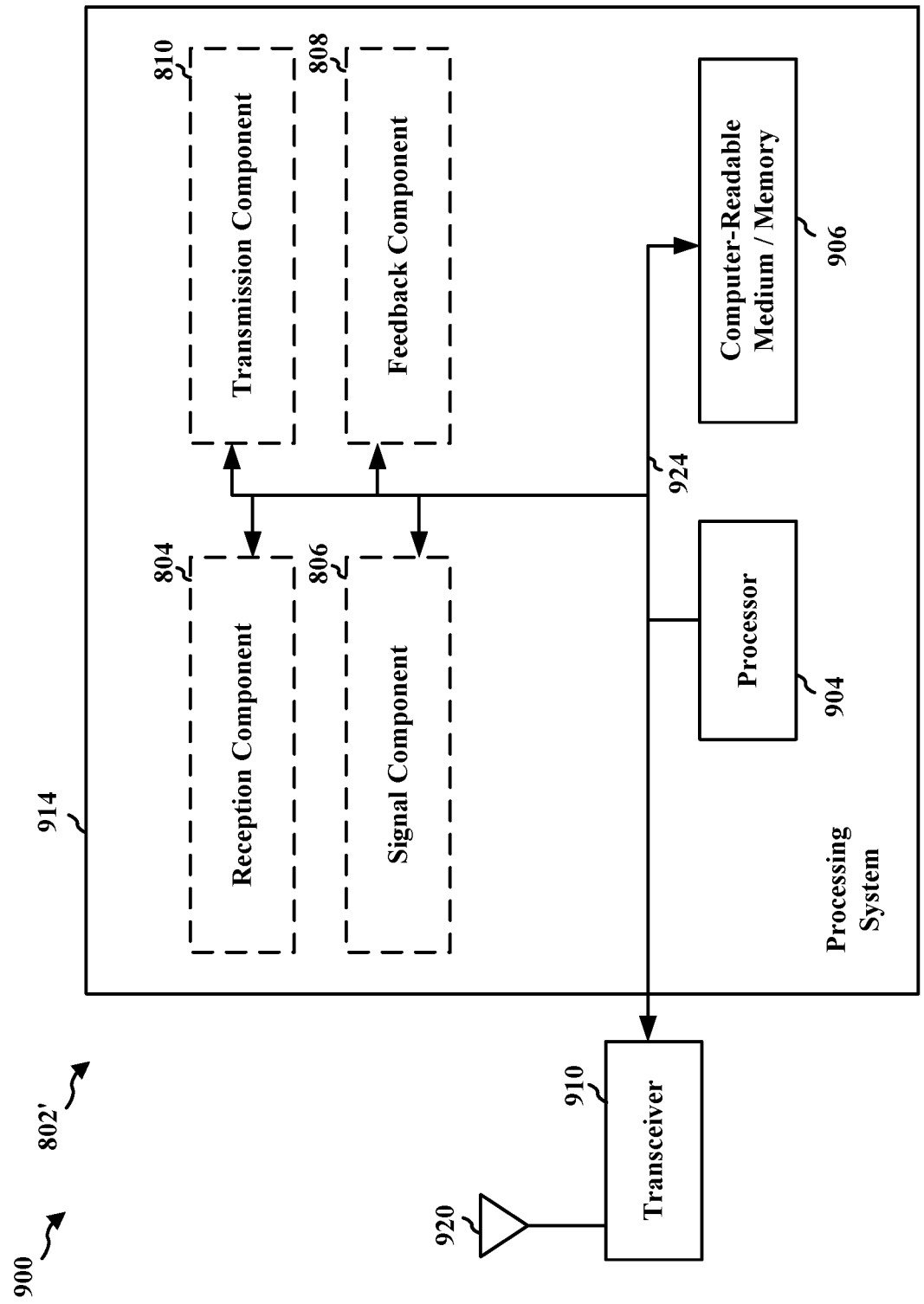
FIG. 9 is a diagram illustrating an example of a hardware implementation for an apparatus employing a processing system.

FIG. 9 is a diagram 900 illustrating an example of a hardware implementation for an apparatus 802' employing a processing system 914. The processing system 914 may be implemented with a bus architecture, represented generally by the bus 924. The bus 924 may include any number of interconnecting buses and bridges depending on the specific application of the processing system 914 and the overall design constraints. The bus 924 links together various circuits including one or more processors and/or hardware components, represented by the processor 904, the components 804, 806, 808, 810 and the computer-readable medium/memory 906. The bus 924 may also link various other circuits such as timing sources, peripherals, voltage regulators, and power management circuits, which are well known in the art, and therefore, will not be described any further.

The processing system 914 may be coupled to a transceiver 910. The transceiver 910 is coupled to one or more antennas 920. The transceiver 910 provides a means for communicating with various other apparatus over a transmission medium. The transceiver 910 receives a signal from the one or more antennas 920, extracts information from the received signal, and provides the extracted information to the processing system 914, specifically the reception component 804. In addition, the transceiver 910 receives information from the processing system 914, specifically the transmission component 810, and based on the received information, generates a signal to be applied to the one or more antennas 920. The processing system 914 includes a processor 904 coupled to a computer-readable medium/memory 906. The processor 904 is responsible for general processing, including the execution of software stored on the computer-readable medium/memory 906. The software, when executed by the processor 904, causes the processing system 914 to perform the various functions described supra for any particular apparatus. The computer-readable medium/memory 906 may also be used for storing data that is manipulated by the processor 904 when executing software. The processing system 914 further includes at least one of the components 804, 806, 808. The components may be software components running in the processor 904, resident/stored in the computer readable medium/memory 906, one or more hardware components coupled to the processor 904, or some combination thereof. The processing system 914 may be a component of the base station 310 and may include the memory 376 and/or at least one of the TX processor 316, the RX processor 370, and the controller/processor 375.

In one configuration, the apparatus 802/802' for wireless communication includes means for generating, by the apparatus 802/802', a reference signal having a non-constant envelope for nonlinearity estimation by a receiver. The apparatus 802/802' may include means for transmitting, by the apparatus, the reference signal. In one aspect, the reference signal comprises a primary synchronization signal. In one aspect, the primary synchronization signal is based on a Zadoff-Chu sequence. In one aspect, the reference signal comprises one of a STS or a GI. In an aspect, the reference signal comprises a preamble having the non-constant envelope. In an aspect, the means for generating the reference signal having the non-constant envelope is configured to modulate the reference signal to have a first dynamic range, the first dynamic range being higher than a second dynamic range of another signal having a constant envelope. In one aspect, the apparatus 802/802' further includes means for receiving, from the receiver, feedback associated with the nonlinearity estimation, and means for performing at least one DPD operation based on the feedback. In one aspect, the means for performing at least one DPD operation based on the feedback is configured to adjust one or more coefficients associated with at least one of a HPA or a DAC.

The aforementioned means may be one or more of the aforementioned components of the apparatus 802 and/or the processing system 914 of the apparatus 802' configured to perform the functions recited by the aforementioned means. As described supra, the processing system 914 may include the TX Processor 316, the RX Processor 370, and the controller/processor 375. As such, in one configuration, the aforementioned means may be the TX Processor 316, the RX Processor 370, and the controller/processor 375 configured to perform the functions recited by the aforementioned means.

Figure 10:
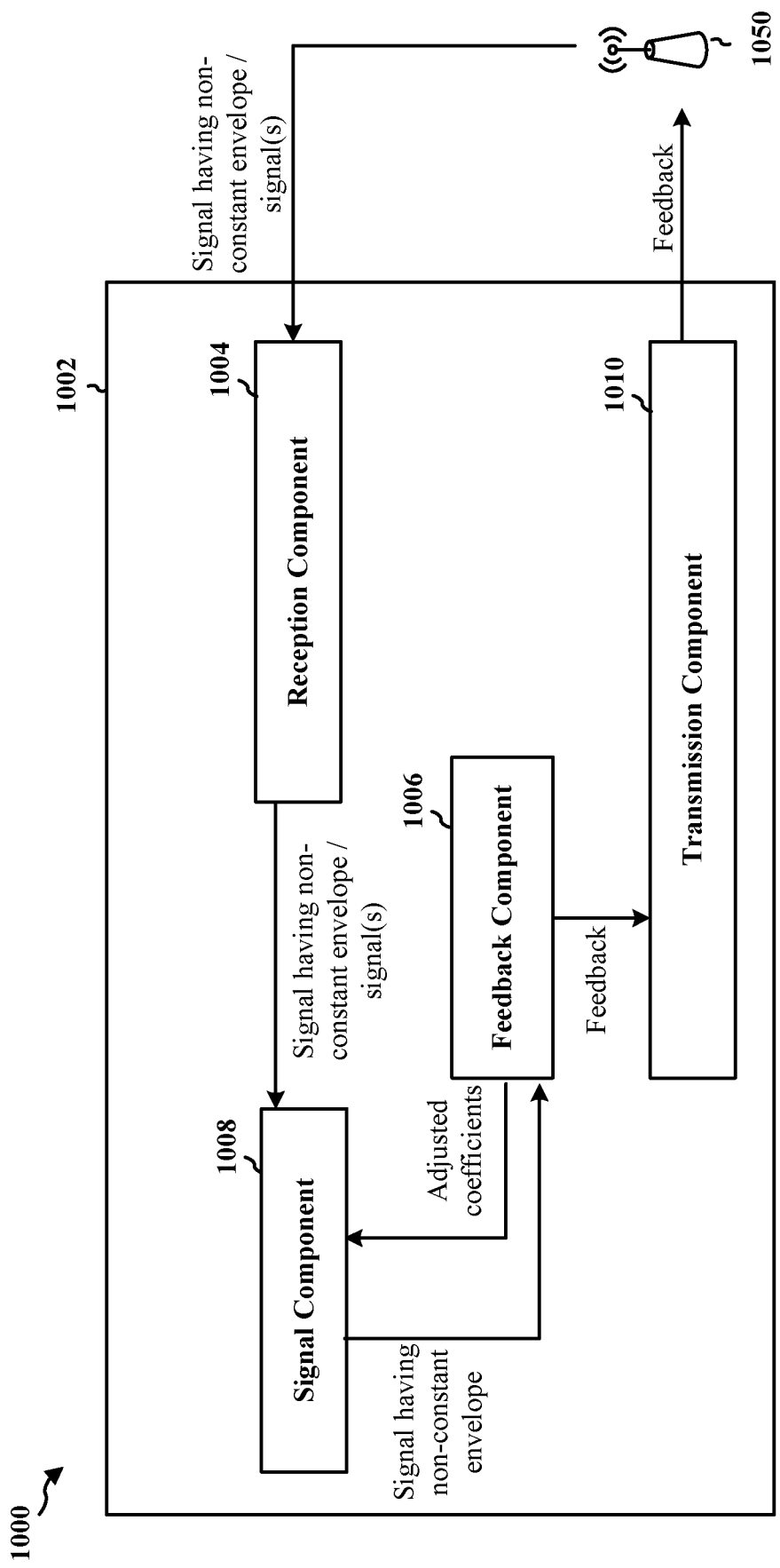
FIG. 10 is a conceptual data flow diagram illustrating the data flow between different means/components in an exemplary apparatus.

FIG. 10 is a conceptual data flow diagram 1000 illustrating the data flow between different means/components in an exemplary apparatus 1002. The apparatus may be a transmitter, such as a UE. The apparatus 1002 may include a reception component 1004, e.g., to receive signals from a base station 1050. The apparatus 1002 may include a transmission component 1010, e.g., to transmit signals to the base station 1050.

The reception component 1004 may receive, from the base station 1050, a reference signal having a non-constant envelope. The reception component 1004 may provide the reference signal to a signal component 1008. In one aspect, the reference signal may include a PSS. In one aspect, the PSS may be based on a Zadoff-Chu sequence. In one aspect, the reference signal includes at least one of an STS and/or a GI. In one aspect, the reference signal comprises a preamble having the non-constant envelope.

The signal component 1008 may estimate at least one nonlinearity characteristic based on the reference signal having the non-constant envelope. In one aspect, the signal component 1008 may estimate the at least one nonlinearity characteristic based on a least-squares algorithm.

The signal component 1008 may provide the at least one nonlinearity characteristic to the feedback component 1006. In one aspect, the feedback component 1006 may generate feedback based on the at least one nonlinearity characteristic. The feedback component 1006 may provide the feedback to the transmission component 1010 for transmission to the base station 1050.

In one aspect, the feedback component 1006 may perform at least one DPoD operation based on the at least one nonlinearity characteristic. The feedback component 1006 may perform at least one DPoD operation by adjusting one or more coefficients associated with at least one of an LNA and/or an ADC. The adjusted coefficients may be used for receiving additional signals from the base station 1050.

The apparatus may include additional components that perform each of the blocks of the algorithm in the aforementioned flowcharts of FIG. 7. As such, each block in the aforementioned flowcharts of FIG. 7 may be performed by a component and the apparatus may include one or more of those components. The components may be one or more hardware components specifically configured to carry out the stated processes/algorithm, implemented by a processor configured to perform the stated processes/algorithm, stored within a computer-readable medium for implementation by a processor, or some combination thereof.

Figure 11:
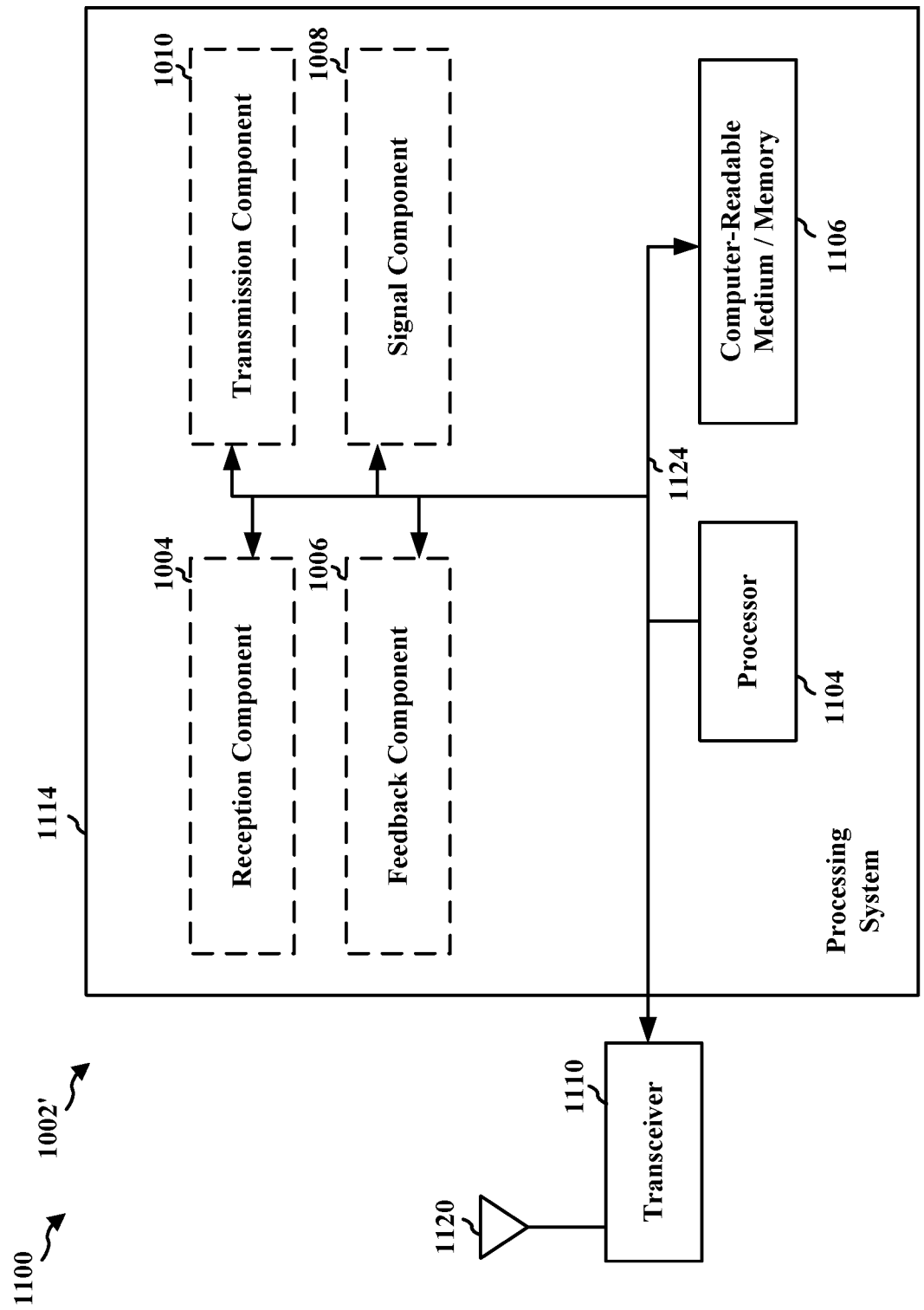
FIG. 11 is a diagram illustrating an example of a hardware implementation for an apparatus employing a processing system.

FIG. 11 is a diagram 1100 illustrating an example of a hardware implementation for an apparatus 1002' employing a processing system 1114. The processing system 1114 may be implemented with a bus architecture, represented generally by the bus 1124. The bus 1124 may include any number of interconnecting buses and bridges depending on the specific application of the processing system 1114 and the overall design constraints. The bus 1124 links together various circuits including one or more processors and/or hardware components, represented by the processor 1104, the components 1004, 1006, 1008, 1010 and the computer-readable medium/memory 1106. The bus 1124 may also link various other circuits such as timing sources, peripherals, voltage regulators, and power management circuits, which are well known in the art, and therefore, will not be described any further.

The processing system 1114 may be coupled to a transceiver 1110. The transceiver 1110 is coupled to one or more antennas 1120. The transceiver 1110 provides a means for communicating with various other apparatus over a transmission medium. The transceiver 1110 receives a signal from the one or more antennas 1120, extracts information from the received signal, and provides the extracted information to the processing system 1114, specifically the reception component 1004. In addition, the transceiver 1110 receives information from the processing system 1114, specifically the transmission component 1010, and based on the received information, generates a signal to be applied to the one or more antennas 1120. The processing system 1114 includes a processor 1104 coupled to a computer-readable medium/memory 1106. The processor 1104 is responsible for general processing, including the execution of software stored on the computer-readable medium/memory 1106. The software, when executed by the processor 1104, causes the processing system 1114 to perform the various functions described supra for any particular apparatus. The computer-readable medium/memory 1106 may also be used for storing data that is manipulated by the processor 1104 when executing software. The processing system 1114 further includes at least one of the components 1004, 1006, 1008, 1010. The components may be software components running in the processor 1104, resident/stored in the computer readable medium/memory 1106, one or more hardware components coupled to the processor 1104, or some combination thereof. The processing system 1114 may be a component of the UE 350 and may include the memory 360 and/or at least one of the TX processor 368, the RX processor 356, and the controller/processor 359.

In one configuration, the apparatus 1002/1002' for wireless communication includes means for receiving, from a receiver, feedback associated with the nonlinearity estimation. The apparatus 1002/1002' may include means for receiving a reference signal having a non-constant envelope. The apparatus 1002/1002' may include means for estimating at least one nonlinearity characteristic based on the reference signal having the non-constant envelope. The apparatus 1002/1002' may include at least one of: means for transmitting feedback based on the at least one nonlinearity characteristic, or means for performing at least one DPoD operation based on the at least one nonlinearity characteristic. In an aspect, the reference signal comprises a primary synchronization signal. In an aspect, the primary synchronization signal is based on a Zadoff-Chu sequence. In an aspect, the reference signal comprises one of a STS or a GI. In an aspect, the reference signal comprises a preamble having the non-constant envelope. In an aspect, the estimating the at least one nonlinearity characteristic based on the reference signal having the non-constant envelope is based on a least-squares algorithm. In an aspect, means for performing the at least one DPoD operation based on the at least one nonlinearity characteristic is configured to adjust one or more coefficients associated with at least one of a LNA or an ADC.

The aforementioned means may be one or more of the aforementioned components of the apparatus 1002 and/or the processing system 1114 of the apparatus 1002' configured to perform the functions recited by the aforementioned means. As described supra, the processing system 1114 may include the TX Processor 368, the RX Processor 356, and the controller/processor 359. As such, in one configuration, the aforementioned means may be the TX Processor 368, the RX Processor 356, and the controller/processor 359 configured to perform the functions recited by the aforementioned means.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. A method of wireless communication by a transmitter, the method comprising:
   generating, by the transmitter, a reference signal having a non-constant envelope for nonlinearity estimation by a receiver, wherein the generating the reference signal comprises modulating the reference signal to have a first dynamic range, the first dynamic range being higher than a second dynamic range of another signal having a constant envelope; and
   transmitting, by the transmitter, the reference signal.

2. The method of claim 1, wherein the reference signal comprises a primary synchronization signal.

3. The method of claim 2, wherein the primary synchronization signal is based on a Zadoff-Chu sequence.

4. The method of claim 1, wherein the reference signal comprises one of a short training sequence (STS) or a guard interval (GI).

5. The method of claim 1, wherein the reference signal comprises a preamble having the non-constant envelope.

6. The method of claim 1, further comprising:
   receiving, from the receiver, feedback associated with the nonlinearity estimation; and
   performing at least one digital pre-distortion (DPD) operation based on the feedback.

7. The method of claim 6, wherein the performance of the at least one DPD operation based on the feedback comprises adjusting one or more coefficients associated with at least one of a high-power amplifier (HPA) or a digital to analog converter (DAC).

8. A method of wireless communication by a receiver, the method comprising:
   receiving a reference signal having a non-constant envelope, the reference signal having a first dynamic range that is higher than a second dynamic range of another signal having a constant envelope;
   estimating at least one nonlinearity characteristic based on the reference signal having the non-constant envelope; and
   at least one of:
      transmitting feedback based on the at least one nonlinearity characteristic, or
      performing at least one digital post distortion (DPoD) operation based on the at least one nonlinearity characteristic.

9. The method of claim 8, wherein the reference signal comprises a primary synchronization signal.

10. The method of claim 8, wherein the primary synchronization signal is based on a Zadoff-Chu sequence.

11. The method of claim 8, wherein the reference signal comprises one of a short training sequence (STS) or a guard interval (GI).

12. The method of claim 8, wherein the reference signal comprises a preamble having the non-constant envelope.

13. The method of claim 8, wherein the estimation of the at least one nonlinearity characteristic based on the reference signal having the non-constant envelope is based on a least-squares algorithm.

14. The method of claim 8, wherein the performance of the at least one DPoD operation based on the at least one nonlinearity characteristic comprises adjusting one or more coefficients associated with at least one of a low-noise amplifier (LNA) or an analog to digital converter (ADC).

15. An apparatus for wireless communication, the apparatus comprising:
   a memory; and
   at least one processor coupled to the memory and configured to:
      generate a reference signal having a non-constant envelope for nonlinearity estimation by a receiver, wherein the generation of the reference signal comprises modulation of the reference signal to have a first dynamic range, the first dynamic range being higher than a second dynamic range of another signal having a constant envelope; and transmit the reference signal.

16. The apparatus of claim 15, wherein the reference signal comprises a primary synchronization signal.

17. The apparatus of claim 16, wherein the primary synchronization signal is based on a Zadoff-Chu sequence.

18. The apparatus of claim 15, wherein the reference signal comprises one of a short training sequence (STS) or a guard interval (GI).

19. The apparatus of claim 15, wherein the reference signal comprises a preamble having the non-constant envelope.

20. The apparatus of claim 15, wherein the at least one processor is further configured to:

receive, from the receiver, feedback associated with the nonlinearity estimation; and perform at least one digital pre-distortion (DPD) operation based on the feedback.

21. The apparatus of claim 20, wherein the performance of the at least one DPD operation based on the feedback comprises adjustment of one or more coefficients associated with at least one of a high-power amplifier (HPA) or a digital to analog converter (DAC).

22. A apparatus of wireless communication by a receiver, the apparatus comprising:

a memory; and at least one processor coupled to the memory and configured to:

receive reference signal having a non-constant envelope, the reference signal having a first dynamic range that is higher than a second dynamic range of another signal having a constant envelope;

estimate at least one nonlinearity characteristic based on the reference signal having the non-constant envelope; and at least one of:

transmit feedback based on the at least one nonlinearity characteristic, or perform at least one digital post distortion (DPoD) operation based on the at least one nonlinearity characteristic.

23. The apparatus of claim 22, wherein the reference signal comprises a primary synchronization signal.

24. The apparatus of claim 22, wherein the primary synchronization signal is based on a Zadoff-Chu sequence.

25. The apparatus of claim 22, wherein the reference signal comprises one of a short training sequence (STS) or a guard interval (GI).

26. The apparatus of claim 22, wherein the reference signal comprises a preamble having the non-constant envelope.

27. The apparatus of claim 22, wherein the estimation of the at least one nonlinearity characteristic based on the reference signal having the non-constant envelope is based on a least-squares algorithm.

28. The apparatus of claim 22, wherein the performance of the at least one DPoD operation based on the at least one nonlinearity characteristic comprises adjustment of one or more coefficients associated with at least one of a low-noise amplifier (LNA) or an analog to digital converter (ADC).

29. An apparatus for wireless communication, the apparatus comprising:

means for generating a reference signal having a non-constant envelope for nonlinearity estimation by a receiver, wherein the means for generating is configured to modulate the reference signal to have a first dynamic range, the first dynamic range being higher than a second dynamic range of another signal having a constant envelope; and means for transmitting the reference signal.

30. The apparatus of claim 29, wherein the reference signal comprises a primary synchronization signal.

31. The apparatus of claim 30, wherein the primary synchronization signal is based on a Zadoff-Chu sequence.

32. The apparatus of claim 29, wherein the reference signal comprises one of a short training sequence (STS) or a guard interval (GI).

33. The apparatus of claim 29, wherein the reference signal comprises a preamble having the non-constant envelope.

34. The apparatus of claim 29, further comprising:

means for receiving, from the receiver, feedback associated with the nonlinearity estimation; and means for performing at least one digital pre-distortion (DPD) operation based on the feedback.

35. The apparatus of claim 34, wherein the means for performing the at least one DPD operation based on the feedback is configured to adjust one or more coefficients associated with at least one of a high-power amplifier (HPA) or a digital to analog converter (DAC).

36. A apparatus of wireless communication by a receiver, the apparatus comprising:

means for receiving a reference signal having a non-constant envelope, the reference signal having a first dynamic range that is higher than a second dynamic range of another signal having a constant envelope;

means for estimating at least one nonlinearity characteristic based on the reference signal having the non-constant envelope; and at least one of:

means for transmitting feedback based on the at least one nonlinearity characteristic, or means for performing at least one digital post distortion (DPoD) operation based on the at least one nonlinearity characteristic.

37. The apparatus of claim 36, wherein the reference signal comprises a primary synchronization signal.

38. The apparatus of claim 36, wherein the primary synchronization signal is based on a Zadoff-Chu sequence.

39. The apparatus of claim 36, wherein the reference signal comprises one of a short training sequence (STS) or a guard interval (GI).

40. The apparatus of claim 36, wherein the reference signal comprises a preamble having the non-constant envelope.

41. The apparatus of claim 36, wherein the estimating the at least one nonlinearity characteristic based on the reference signal having the non-constant envelope is based on a least-squares algorithm.

42. The apparatus of claim 36, wherein the means for performing the at least one DPoD operation based on the at least one nonlinearity characteristic is configured to adjust of one or more coefficients associated with at least one of a low-noise amplifier (LNA) or an analog to digital converter (ADC).

43. A non-transitory, computer-readable medium storing computer-executable code for wireless communication by a transmitter, comprising code to:

generate, by the transmitter, a reference signal having a non-constant envelope for nonlinearity estimation by a receiver, wherein the generation of the reference signal comprises modulation of the reference signal to have a first dynamic range, the first dynamic range being higher than a second dynamic range of another signal having a constant envelope; and transmit, by the transmitter, the reference signal.

44. A non-transitory, computer-readable medium storing computer-executable code for wireless communication by a receiver, comprising code to:

receive a reference signal having a non-constant envelope, the reference signal having a first dynamic range that is higher than a second dynamic range of another signal having a constant envelope;

estimate at least one nonlinearity characteristic based on the reference signal having the non-constant envelope; and at least one of:
    transmit feedback based on the at least one nonlinearity characteristic, or
    perform at least one digital post distortion (DPoD) operation based on the at least one nonlinearity characteristic.

* * * * *